(12) United States Patent
Chi et al.

(10) Patent No.: US 11,380,542 B2
(45) Date of Patent: *Jul. 5, 2022

(54) SELECTIVE CAPPING PROCESSES AND STRUCTURES FORMED THEREBY

(71) Applicant: Taiwan Semiconductor Manufacturing Co., Ltd., Hsinchu (TW)

(72) Inventors: Chih-Chien Chi, Hsinchu (TW); Pei-Hsuan Lee, Taipei (TW); Hung-Wen Su, Jhubei (TW); Hsiao-Kuan Wei, Longtan Township (TW); Jui-Fen Chien, Taichung (TW); Hsin-Yun Hsu, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/013,316

(22) Filed: Sep. 4, 2020

(65) Prior Publication Data

US 2020/0402795 A1 Dec. 24, 2020

Related U.S. Application Data

(60) Continuation of application No. 16/206,192, filed on Nov. 30, 2018, now Pat. No. 10,770,288, which is a
(Continued)

(51) Int. Cl.
*H01L 21/02* (2006.01)
*H01L 21/20* (2006.01)
(Continued)

(52) U.S. Cl.
CPC .. *H01L 21/02362* (2013.01); *H01L 21/02639* (2013.01); *H01L 21/2018* (2013.01);
(Continued)

(58) Field of Classification Search
CPC ......... H01L 21/02362; H01L 21/02369; H01L 21/2018; H01L 21/28088; H01L 21/28194;
(Continued)

(56) References Cited

U.S. PATENT DOCUMENTS 9,105,490 B2  8/2015  Wang et al.
9,236,267 B2  1/2016  De et al.
(Continued)

FOREIGN PATENT DOCUMENTS

CN   103137488 A   6/2013
CN   103996652 A   8/2014
(Continued)

OTHER PUBLICATIONS

Au et al., "Selective Chemical Vapor Deposition of Manganese Self-Aligned Capping Layer for Cu Interconnections in Microelectronics," Journal of the Electrochemical Society, 157 (6), Apr. 26, 2010, pp. D341-D345.
(Continued)

*Primary Examiner* — Tong-Ho Kim
(74) *Attorney, Agent, or Firm* — Slater Matsil, LLP

(57) ABSTRACT

Embodiments disclosed herein relate generally to capping processes and structures formed thereby. In an embodiment, a conductive feature, formed in a dielectric layer, has a metallic surface, and the dielectric layer has a dielectric surface. The dielectric surface is modified to be hydrophobic by performing a surface modification treatment. After modifying the dielectric surface, a capping layer is formed on the metallic surface by performing a selective deposition process. In another embodiment, a surface of a gate structure is exposed through a dielectric layer. A capping layer is formed on the surface of the gate structure by performing a selective deposition process.

20 Claims, 25 Drawing Sheets

Related U.S. Application Data division of application No. 15/880,389, filed on Jan. 25, 2018, now Pat. No. 10,790,142.

(60) Provisional application No. 62/591,598, filed on Nov. 28, 2017.

(51) Int. Cl.

| | |
|---|---|
| *H01L 29/66* | (2006.01) |
| *H01L 21/762* | (2006.01) |
| *H01L 29/49* | (2006.01) |
| *H01L 21/324* | (2006.01) |
| *H01L 21/28* | (2006.01) |
| *H01L 27/092* | (2006.01) |
| *H01L 29/423* | (2006.01) |
| *H01L 29/78* | (2006.01) |
| *H01L 21/3205* | (2006.01) |
| *H01L 29/417* | (2006.01) |
| *H01L 21/3105* | (2006.01) |
| *H01L 21/768* | (2006.01) |

(52) U.S. Cl.
CPC .. *H01L 21/28088* (2013.01); *H01L 21/28194* (2013.01); *H01L 21/3105* (2013.01); *H01L 21/3245* (2013.01); *H01L 21/32051* (2013.01); *H01L 21/768* (2013.01); *H01L 21/76262* (2013.01); *H01L 27/0924* (2013.01); *H01L 29/41791* (2013.01); *H01L 29/4238* (2013.01); *H01L 29/4975* (2013.01); *H01L 29/66545* (2013.01); *H01L 29/66636* (2013.01); *H01L 29/66795* (2013.01); *H01L 29/785* (2013.01); *H01L 21/76224* (2013.01)

(58) Field of Classification Search
CPC ........... H01L 21/3105; H01L 21/32051; H01L 21/3245; H01L 21/76224; H01L 21/76262; H01L 21/768; H01L 27/0924; H01L 29/41791; H01L 29/4238; H01L 29/4975; H01L 29/66545; H01L 29/666361; H01L 29/66795; H01L 29/785
USPC ....................................................... 257/369
See application file for complete search history.

(56) References Cited

U.S. PATENT DOCUMENTS

| | | | |
|---|---|---|---|
| 9,236,300 B2 | 1/2016 | Liaw | |
| 9,349,687 B1 | 5/2016 | Gates et al. | |
| 9,406,804 B2 | 8/2016 | Huang et al. | |
| 9,437,714 B1 | 9/2016 | Adusumilli et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 10,790,142 B2 * | 9/2020 | Chi ................... | H01L 29/41791 |
| 2005/0245100 A1 | 11/2005 | Wu et al. | |
| 2007/0099414 A1 | 5/2007 | Frohberg et al. | |
| 2010/0248473 A1 | 9/2010 | Ishizaka et al. | |
| 2011/0244677 A1 | 10/2011 | Owada | |
| 2012/0114869 A1 | 5/2012 | Miyoshi et al. | |
| 2012/0126295 A1 * | 5/2012 | Edge ................. | H01L 29/66545 |
| | | | 257/288 |
| 2014/0070320 A1 | 3/2014 | Mukherjee et al. | |
| 2014/0231998 A1 | 8/2014 | Kuo et al. | |
| 2015/0035055 A1 | 2/2015 | Wang | |
| 2015/0061147 A1 | 3/2015 | Lin et al. | |
| 2015/0097291 A1 | 4/2015 | Huisinga et al. | |
| 2015/0111373 A1 | 4/2015 | Cote et al. | |
| 2015/0294863 A1 | 10/2015 | Nemani et al. | |
| 2015/0340486 A1 | 11/2015 | Nandakumar et al. | |
| 2016/0276455 A1 | 9/2016 | Yang et al. | |
| 2016/0293725 A1 | 10/2016 | Liou et al. | |
| 2016/0315171 A1 | 10/2016 | Hung et al. | |
| 2016/0365449 A1 | 12/2016 | Chang et al. | |
| 2017/0148670 A1 | 5/2017 | Lei et al. | |
| 2017/0207312 A1 | 7/2017 | Jan et al. | |
| 2017/0221891 A1 * | 8/2017 | Chen ................. | H01L 21/76897 |
| 2018/0151373 A1 | 5/2018 | Tsai et al. | |

FOREIGN PATENT DOCUMENTS

| | | |
|---|---|---|
| CN | 104425451 A | 3/2015 |
| CN | 104576370 A | 4/2015 |
| CN | 104681488 A | 6/2015 |
| CN | 106252411 A | 12/2016 |
| CN | 106601684 A | 4/2017 |
| KR | 20100107228 A | 10/2010 |
| KR | 101318506 B1 | 10/2013 |
| KR | 20170042558 A | 4/2017 |
| TW | 201740441 A | 11/2017 |

OTHER PUBLICATIONS

Itoh et al., "Mechanism for Initial Stage of Selective Tungsten Growth Employing a WF6 and SiH4 Mixture," Japanese Journal of Applied Physics, vol. 30 No. 7, Jul. 1991, pp. 1525-1529.

Lee et al., "Comparative studies on thermal and plasma enhanced atomic layer deposition of Co focusing on area selectivity," 214th ECS Meeting, Abstract #1899, The Electrochemical Society, Oct. 2008, 1 page.

* cited by examiner

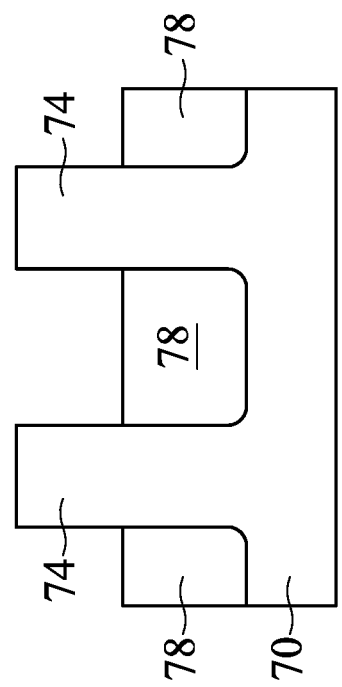
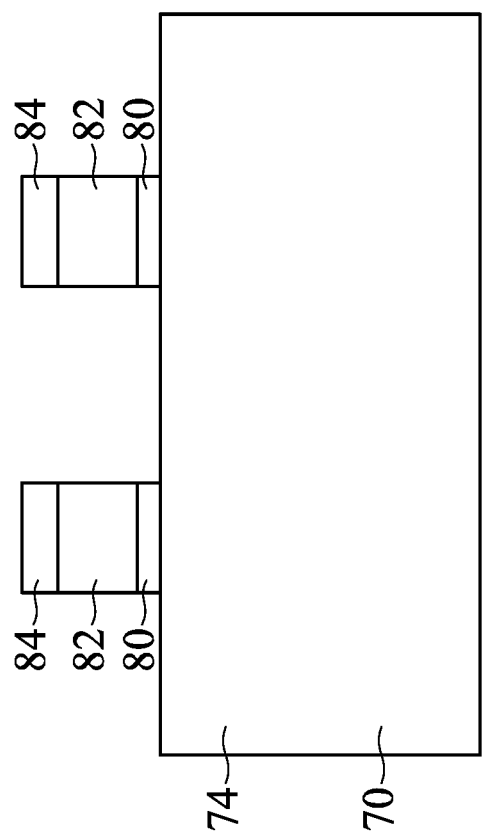
FIG. 5B
FIG. 5A

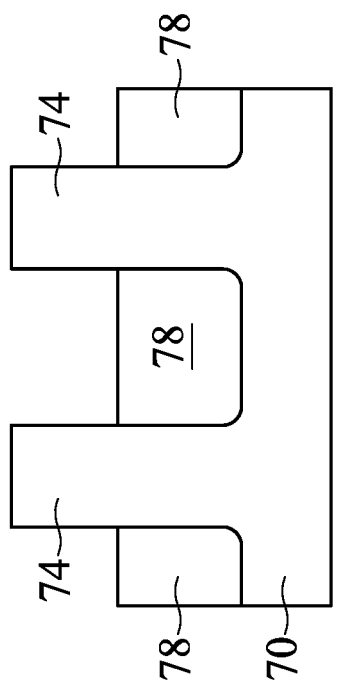
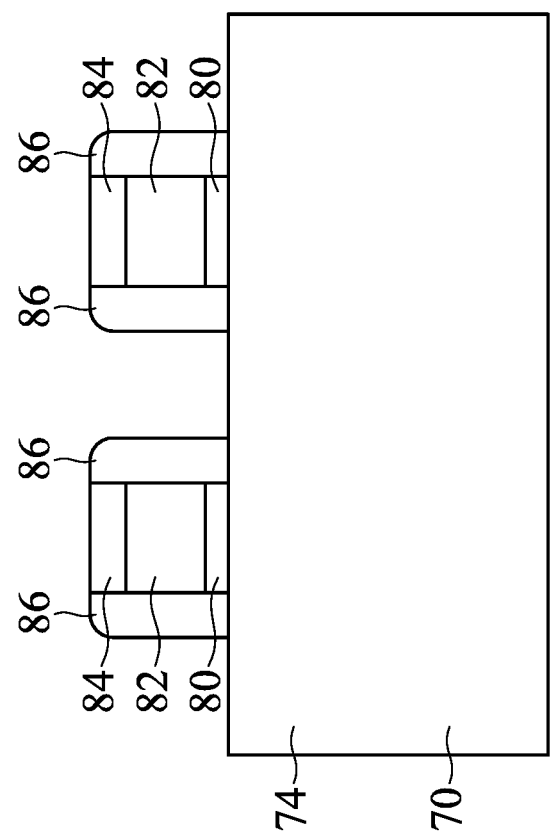
FIG. 6B
FIG. 6A

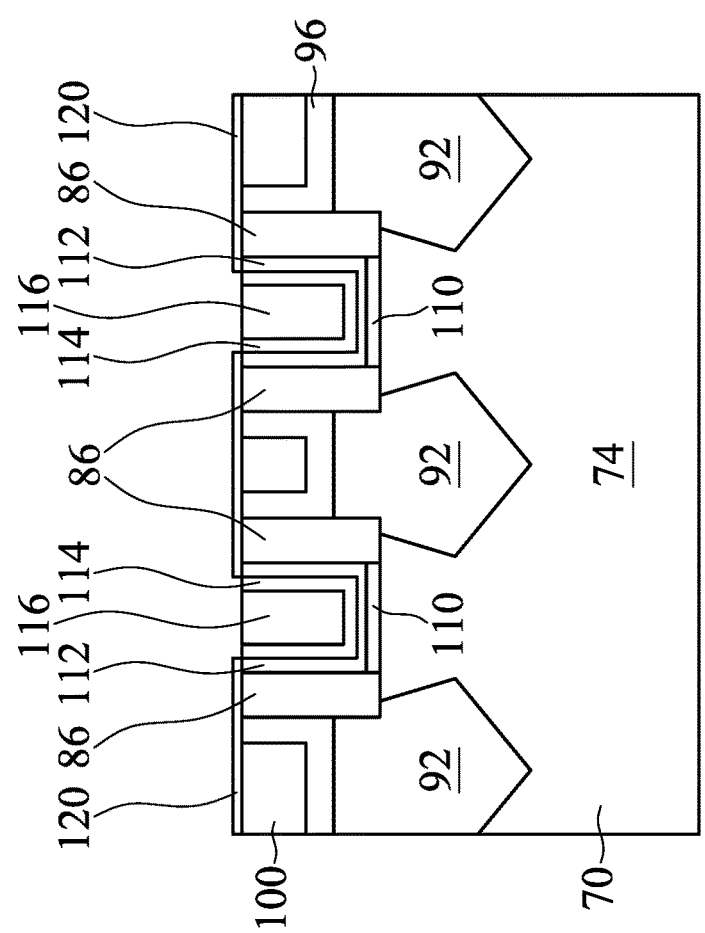
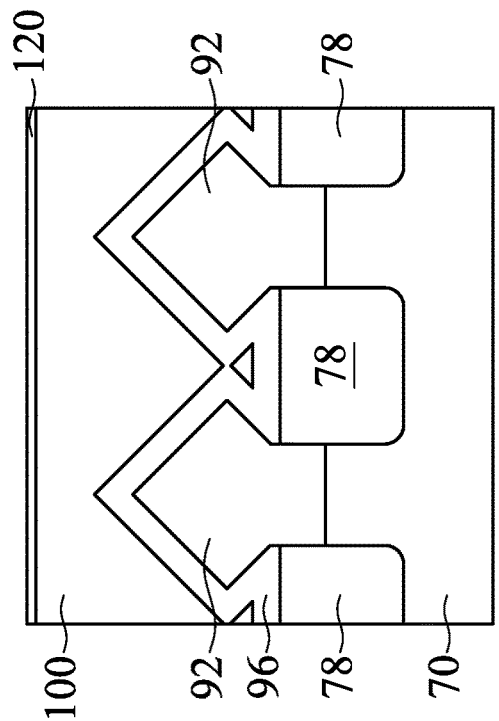
FIG. 11A
FIG. 11B

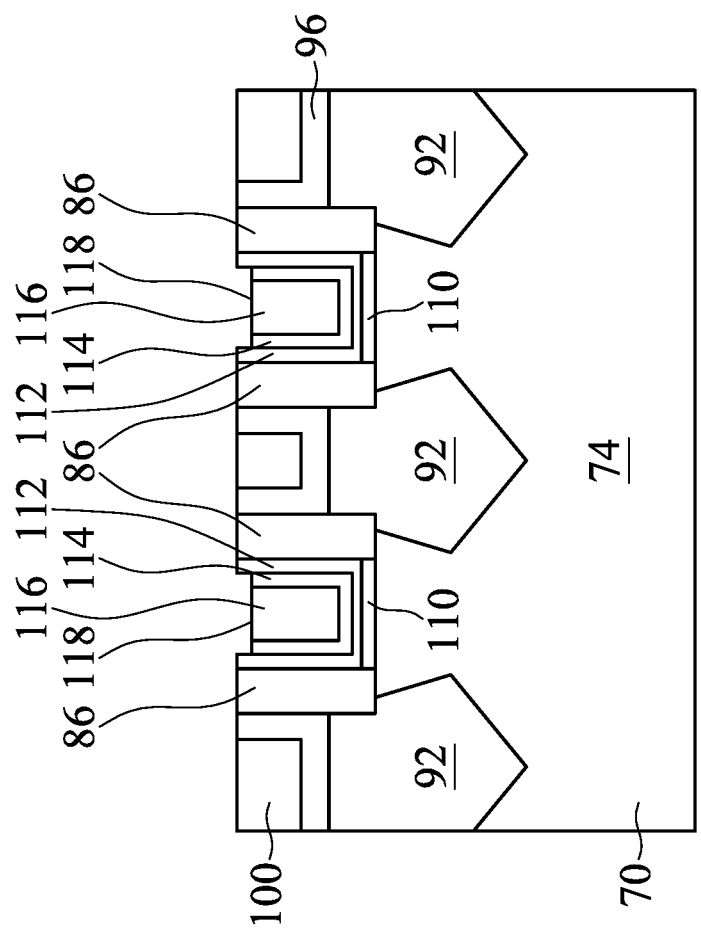
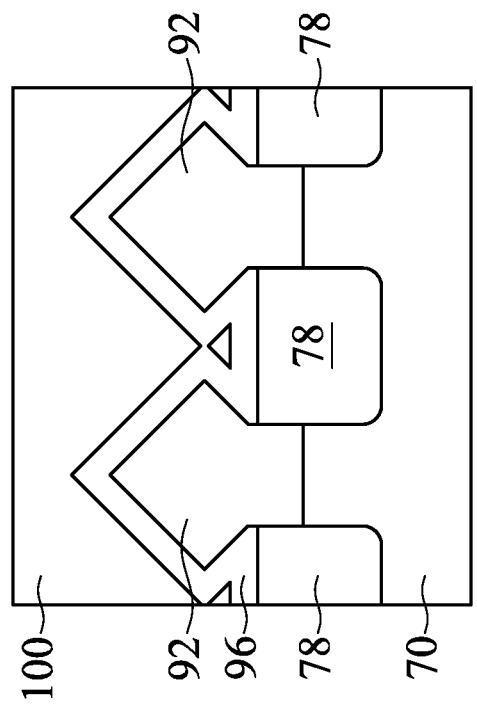
FIG. 16A
FIG. 16B

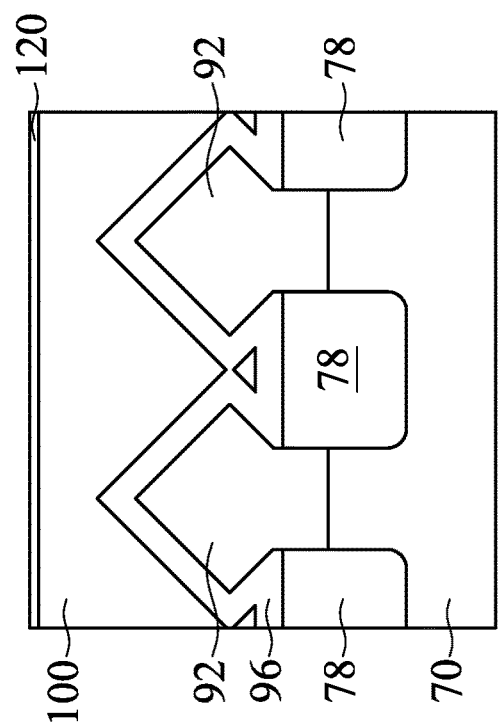
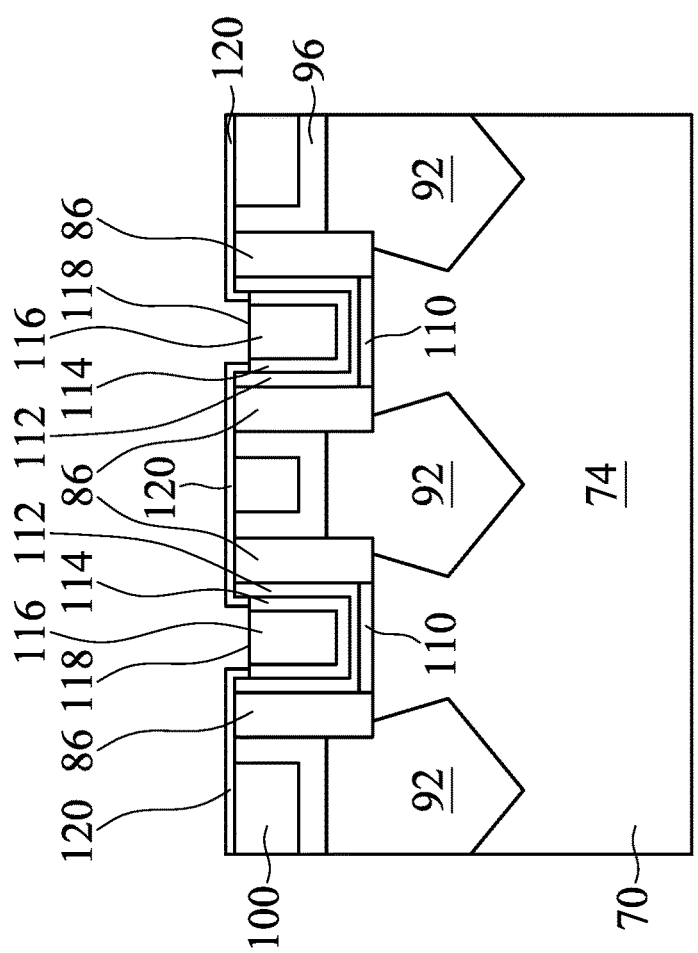
FIG. 17B
FIG. 17A

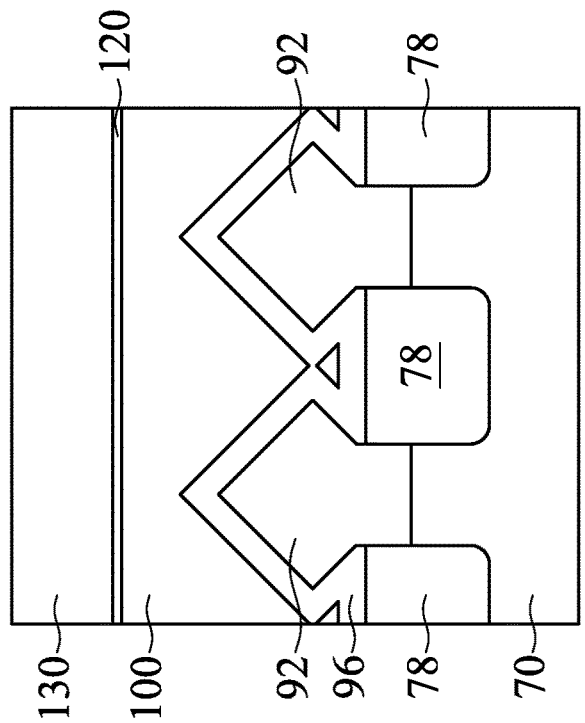
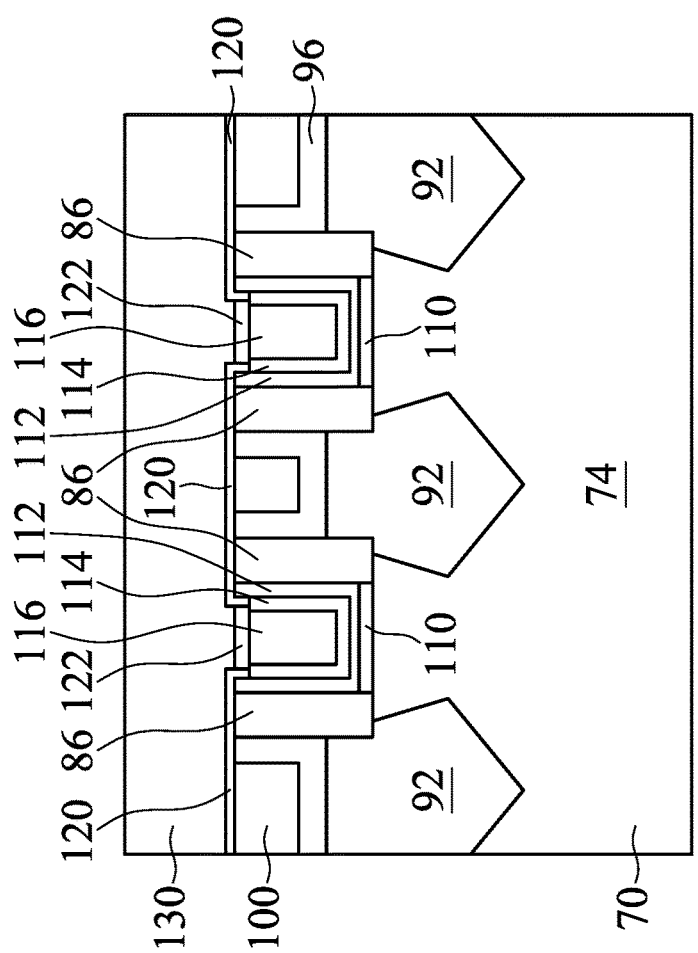
FIG. 19A
FIG. 19B

SELECTIVE CAPPING PROCESSES AND STRUCTURES FORMED THEREBY

PRIORITY CLAIM AND CROSS-REFERENCE

This application is a continuation of U.S. patent application Ser. No. 16/206,192, filed on Nov. 30, 2018, entitled "Selective Capping Processes and Structures Formed Thereby," which is a divisional of U.S. patent application Ser. No. 15/880,389, filed on Jan. 25, 2018, entitled "Selective Capping Processes and Structures Formed Thereby," which application claims the benefit of and priority to U.S. Provisional Patent Application No. 62/591,598, filed on Nov. 28, 2017, entitled "Selective Capping Processes and Structures Formed Thereby," which are incorporated herein by reference in their entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-B, 3A-B, 4A-B, 5A-B, 6A-B, 7A-B, 8A-B, 9A-B, 10A-B, 11A-B, 12A-B, 13A-B, 14A-B, and 15A-B are cross-sectional views of respective intermediate structures at intermediate stages in an example process of forming a semiconductor device in accordance with some embodiments.

FIGS. 16A-B, 17A-B, 18A-B, and 19A-B are cross-sectional views of respective intermediate structures at intermediate stages in another example process of forming a semiconductor device in accordance with some embodiments.

DETAILED DESCRIPTION

Figure 1:
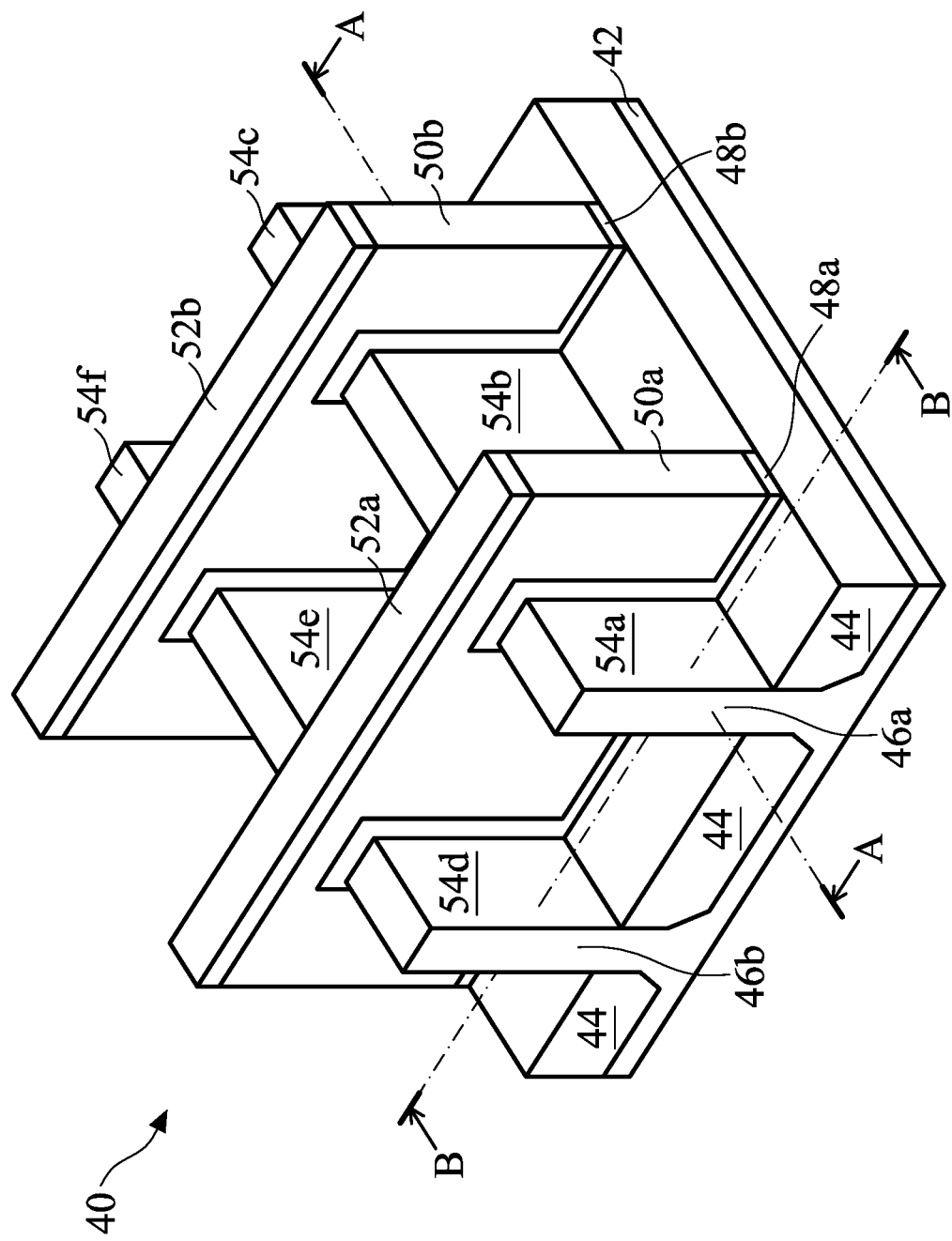
FIG. 1 is a three-dimensional view of example simplified Fin Field Effect Transistors (FinFETs) in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments disclosed herein relate generally to forming a capping layer (e.g., metal cap) on a metallic surface and to structures formed thereby. In some embodiments, a dielectric surface of a dielectric layer can be modified before a selective deposition for forming a capping layer is performed. In such embodiments, the modified surface may serve as a protective layer for the dielectric layer to, for example, improve selectivity of the selective deposition and reduce damage to the dielectric layer. In some embodiments, a selective deposition for forming a capping layer on a gate structure is performed. The capping layer on the gate structure can reduce a resistance of a contact to the gate structure, and more particularly, for a gate structure on a short channel device. Other advantages of some embodiments may be achieved.

The foregoing broadly outlines some aspects of embodiments described herein. Some embodiments described herein are described in the context of Fin Field Effect Transistors (FinFETs), and more particularly, in the context of a replacement gate process for FinFETs. Some embodiments described herein are described in the context of conductive features in a metallization. Implementations of some aspects of the present disclosure may be used in other processes and/or in other devices. For example, other example devices can include planar FETs, Horizontal Gate All Around (HGAA) FETs, Vertical Gate All Around (VGAA) FETs, nanowire channel FETs, and other devices. Other example processes can include a gate-first process. Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein.

FIG. 1 illustrates an example of simplified FinFETs 40 in a three-dimensional view. Other aspects not illustrated in or described with respect to FIG. 1 may become apparent from the following figures and description. The structure in FIG. 1 may be electrically connected or coupled in a manner to operate as, for example, one transistor or more, such as four transistors.

The FinFETs 40 comprise fins 46a and 46b on a semiconductor substrate 42. The semiconductor substrate 42 includes isolation regions 44, and the fins 46a and 46b each protrude above and from between neighboring isolation regions 44. Gate dielectric layers 48a and 48b are along sidewalls and over top surfaces of the fins 46a and 46b, and gate electrodes 50a and 50b are over the gate dielectric layers 48a and 48b, respectively. Further, masks 52a and 52b are over the gate electrodes 50a and 50b, respectively. Source/drain regions 54a-f are disposed in respective regions of the fins 46a and 46b. Source/drain regions 54a and 54b are disposed in opposing regions of the fin 46a with respect to the gate dielectric layer 48a and gate electrode 50a. Source/drain regions 54b and 54c are disposed in opposing regions of the fin 46a with respect to the gate dielectric layer 48b and gate electrode 50b. Source/drain regions 54d and 54e are disposed in opposing regions of the fin 46b with respect to the gate dielectric layer 48a and gate electrode 50a. Source/drain regions 54e and 54f are disposed in opposing regions of the fin 46b with respect to the gate dielectric layer 48b and gate electrode 50b.

In some examples, four transistors may be implemented by including: (1) source/drain regions 54a and 54b, gate dielectric layer 48a, and gate electrode 50a; (2) source/drain regions 54b and 54c, gate dielectric layer 48b, and gate electrode 50b; (3) source/drain regions 54d and 54e, gate dielectric layer 48a, and gate electrode 50a; and (4) source/drain regions 54e and 54f, gate dielectric layer 48b, and gate electrode 50b. As indicated, some source/drain regions may be shared between various transistors, and other source/drain regions that are not illustrated as being shared may be shared with neighboring transistors that are not illustrated, for example. In some examples, various ones of the source/drain regions may be connected or coupled together such that FinFETs are implemented as two functional transistors. For example, if neighboring (e.g., as opposed to opposing) source/drain regions 54a-f are electrically connected, such as through coalescing the regions by epitaxial growth (e.g., source/drain regions 54a and 54d being coalesced, source/drain regions 54b and 54e being coalesced, etc.), two functional transistors may be implemented. Other configurations in other examples may implement other numbers of functional transistors.

FIG. 1 further illustrates reference cross-sections that are used in later figures. Cross-section A-A is in a plane along, e.g., channels in the fin 46a between opposing source/drain regions 54a-c. Cross-section B-B is in a plane perpendicular to cross-section A-A and is across source/drain region 54a in fin 46a and across source/drain region 54d in fin 46b. Subsequent figures refer to these reference cross-sections for clarity. The following figures ending with an "A" designation illustrate cross-sectional views at various instances of processing corresponding to cross-section A-A, and the following figures ending with a "B" designation illustrate cross-sectional views at various instances of processing corresponding to cross-section B-B. In some figures, some reference numbers of components or features illustrated therein may be omitted to avoid obscuring other components or features; this is for ease of depicting the figures.

Figure 2B:
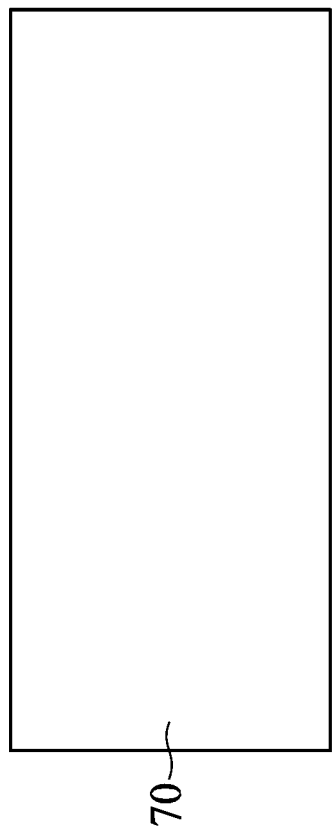
Figure 2A:
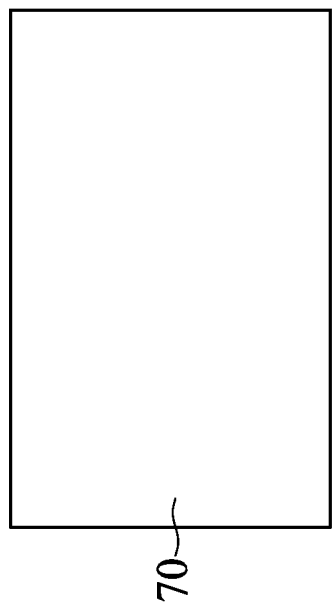

FIGS. 2A-B through 15A-B are cross-sectional views of respective intermediate structures at intermediate stages in an example process of forming a semiconductor device in accordance with some embodiments. FIGS. 2A and 2B illustrate a semiconductor substrate 70. The semiconductor substrate 70 may be or include a bulk semiconductor substrate, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate may include an elemental semiconductor including silicon (Si) or germanium (Ge); a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof.

Figure 3B:
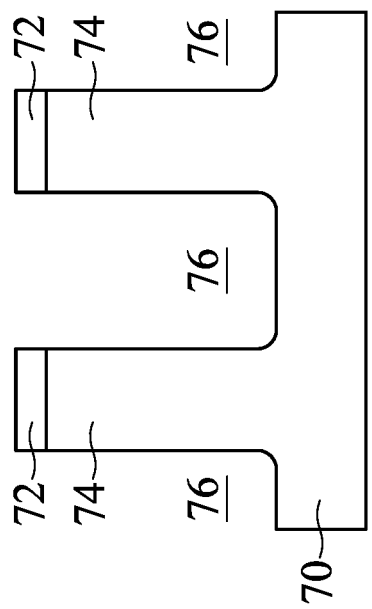
Figure 3A:
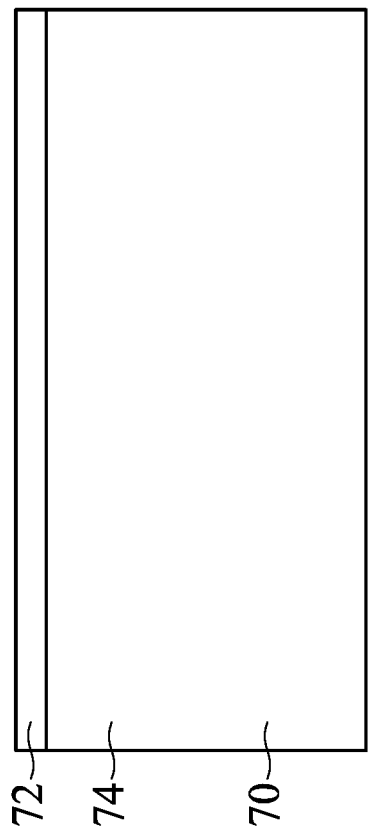

FIGS. 3A and 3B illustrate the formation of fins 74 in the semiconductor substrate 70. In some examples, a mask 72 (e.g., a hard mask) is used in forming the fins 74. For example, one or more mask layers are deposited over the semiconductor substrate 70, and the one or more mask layers are then patterned into the mask 72. In some examples, the one or more mask layers may include or be silicon nitride, silicon oxynitride, silicon carbide, silicon carbon nitride, the like, or a combination thereof, and may be deposited by chemical vapor deposition (CVD), physical vapor deposition (PVD), atomic layer deposition (ALD), or another deposition technique. The one or more mask layers may be patterned using photolithography. For example, a photo resist can be formed on the one or more mask layers, such as by using spin-on coating, and patterned by exposing the photo resist to light using an appropriate photomask. Exposed or unexposed portions of the photo resist may then be removed depending on whether a positive or negative resist is used. The pattern of the photo resist may then be transferred to the one or more mask layers, such as by using a suitable etch process, which forms the mask 72. The etch process may include a reactive ion etch (RIE), neutral beam etch (NBE), inductive coupled plasma (ICP) etch, the like, or a combination thereof. The etch process may be anisotropic. Subsequently, the photo resist is removed in an ashing or wet strip processes, for example.

Using the mask 72, the semiconductor substrate 70 may be etched such that trenches 76 are formed between neighboring pairs of fins 74 and such that the fins 74 protrude from the semiconductor substrate 70. The etch process may include a RIE, NBE, ICP etch, the like, or a combination thereof. The etch process may be anisotropic.

Figure 4B:
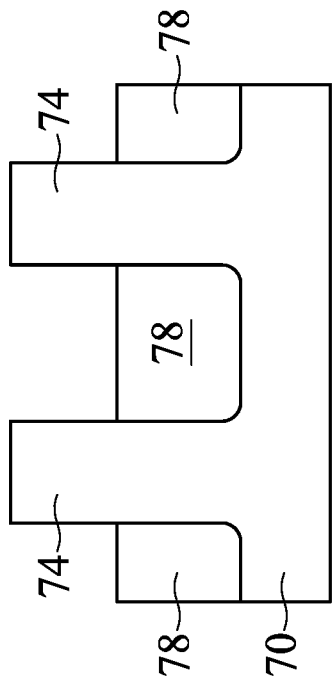
Figure 4A:
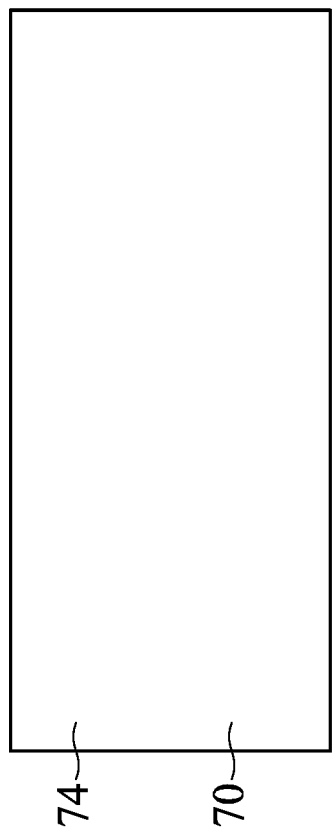

FIGS. 4A and 4B illustrate the formation of isolation regions 78, each in a corresponding trench 76. The isolation regions 78 may include or be an insulating material such as an oxide (such as silicon oxide), a nitride, the like, or a combination thereof, and the insulating material may be formed by a high density plasma CVD (HDP-CVD), a flowable CVD (FCVD) (e.g., a CVD-based material deposition in a remote plasma system and post curing to make it convert to another material, such as an oxide), the like, or a combination thereof. Other insulating materials formed by any acceptable process may be used. In the illustrated embodiment, the isolation regions 78 include silicon oxide that is formed by a FCVD process. A planarization process, such as a chemical mechanical polish (CMP), may remove any excess insulating material and any remaining mask (e.g., used to etch the trenches 76 and form the fins 74) to form top surfaces of the insulating material and top surfaces of the fins 74 to be coplanar. The insulating material may then be recessed to form the isolation regions 78. The insulating material is recessed such that the fins 74 protrude from between neighboring isolation regions 78, which may, at least in part, thereby delineate the fins 74 as active areas on the semiconductor substrate 70. The insulating material may be recessed using an acceptable etch process, such as one that is selective to the material of the insulating material. For example, a chemical oxide removal using a CERTAS® etch or an Applied Materials SICONI tool or dilute hydrofluoric (dHF) acid may be used. Further, top surfaces of the isolation regions 78 may have a flat surface as illustrated, a convex surface, a concave surface (such as dishing), or a combination thereof, which may result from an etch process.

A person having ordinary skill in the art will readily understand that the processes described with respect to FIGS. 2A-B through 4A-B are just examples of how fins 74 may be formed. In other embodiments, a dielectric layer can be formed over a top surface of the semiconductor substrate 70; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 74 can be recessed (e.g., after planarizing the insulating material of the isolation regions 78 and before recessing the insulating material), and a material different from the fins may be epitaxially grown in their place. In an even further embodiment, a dielectric layer can be formed over a top surface of the semiconductor substrate 70; trenches can be etched through the dielectric layer; heteroepitaxial structures can be epitaxially grown in the trenches using a material different from the semiconductor substrate 70; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material for an n-type device different from the material for a p-type device.

FIGS. 5A and 5B illustrate the formation of dummy gate stacks, or more generally, dummy gate structures, on the fins 74. The dummy gate stacks are over and extend laterally perpendicularly to the fins 74. Each dummy gate stack comprises an interfacial dielectric 80, a dummy gate 82, and a mask 84. The interfacial dielectrics 80, dummy gates 82, and masks 84 for the dummy gate stacks may be formed by sequentially forming respective layers, and then patterning those layers into the dummy gate stacks. For example, a layer for the interfacial dielectrics 80 may include or be silicon oxide, silicon nitride, the like, or multilayers thereof, and may be thermally and/or chemically grown on the fins 74, or conformally deposited, such as by plasma-enhanced CVD (PECVD), ALD, or another deposition technique. A layer for the dummy gates 82 may include or be silicon (e.g., polysilicon) or another material deposited by CVD, PVD, or another deposition technique. A layer for the masks 84 may include or be silicon nitride, silicon oxynitride, silicon carbon nitride, the like, or a combination thereof, deposited by CVD, PVD, ALD, or another deposition technique. The layers for the masks 84, dummy gates 82, and interfacial dielectrics 80 may then be patterned, for example, using photolithography and one or more etch processes, like described above, to form the mask 84, dummy gate 82, and interfacial dielectric 80 for each dummy gate stack.

In some embodiments, after forming the dummy gate stacks, lightly doped drain (LDD) regions (not specifically illustrated) may be formed in the active areas. For example, dopants may be implanted into the active areas using the dummy gate stacks as masks. Example dopants for the LDD regions can include or be, for example, boron for a p-type device and phosphorus or arsenic for an n-type device, although other dopants may be used. The LDD regions may have a dopant concentration in a range from about $10^{15}$ cm$^{-3}$ to about $10^{17}$ cm$^{-3}$.

FIGS. 6A and 6B illustrate the formation of gate spacers 86. Gate spacers 86 are formed along sidewalls of the dummy gate stacks (e.g., sidewalls of the interfacial dielectrics 80, dummy gates 82, and masks 84) and over the fins 74. Residual gate spacers 86 may also be formed along sidewalls of the fins 74 (not illustrated in FIG. 6B), for example, depending on the height of the fins 74 above the isolation regions 78. The gate spacers 86 may be formed by conformally depositing one or more layers for the gate spacers 86 and anisotropically etching the one or more layers, for example. The one or more layers for the gate spacers 86 may include or be silicon oxygen carbide, silicon nitride, silicon oxynitride, silicon carbon nitride, the like, multi-layers thereof, or a combination thereof, and may be deposited by CVD, ALD, or another deposition technique. The etch process can include a RIE, NBE, or another etch process.

Figure 7A:
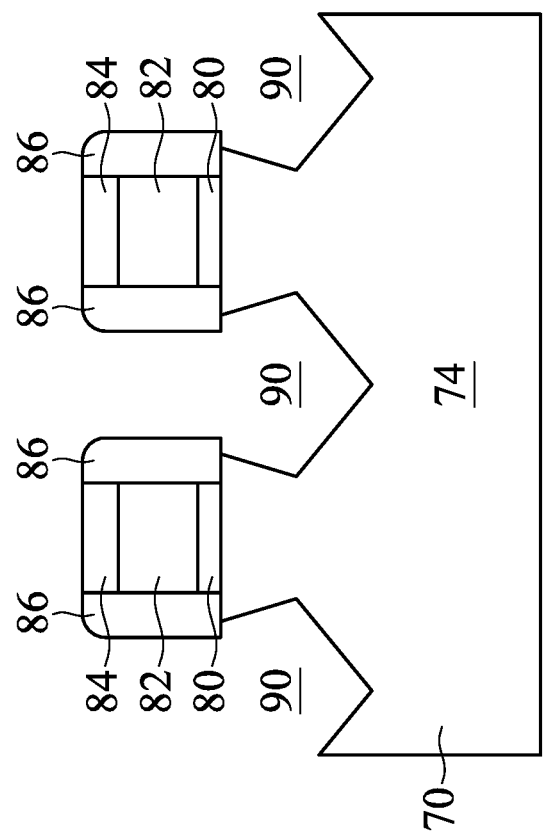
Figure 7B:
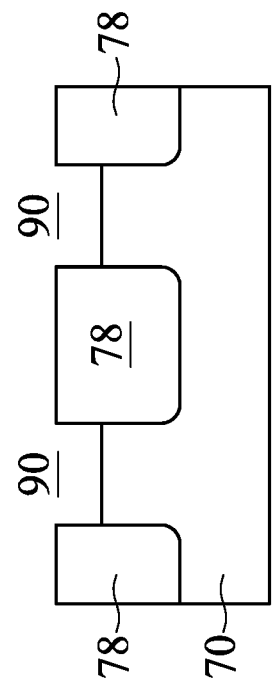

FIGS. 7A and 7B illustrate the formation of recesses 90 for source/drain regions. As illustrated, the recesses 90 are formed in the fins 74 on opposing sides of the dummy gate stacks. The recessing can be by an etch process. The etch process can be isotropic or anisotropic, or further, may be selective with respect to one or more crystalline planes of the semiconductor substrate 70. Hence, the recesses 90 can have various cross-sectional profiles based on the etch process implemented. The etch process may be a dry etch, such as a RIE, NBE, or the like, or a wet etch, such as using tetramethylammonium hydroxide (TMAH), ammonium hydroxide (NH$_4$OH), or another etchant.

Figure 8B:
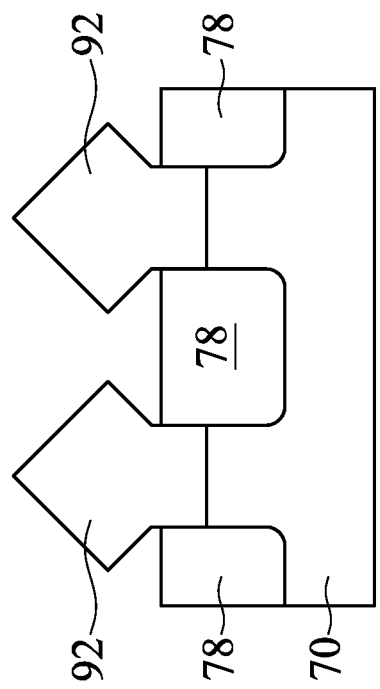
Figure 8A:
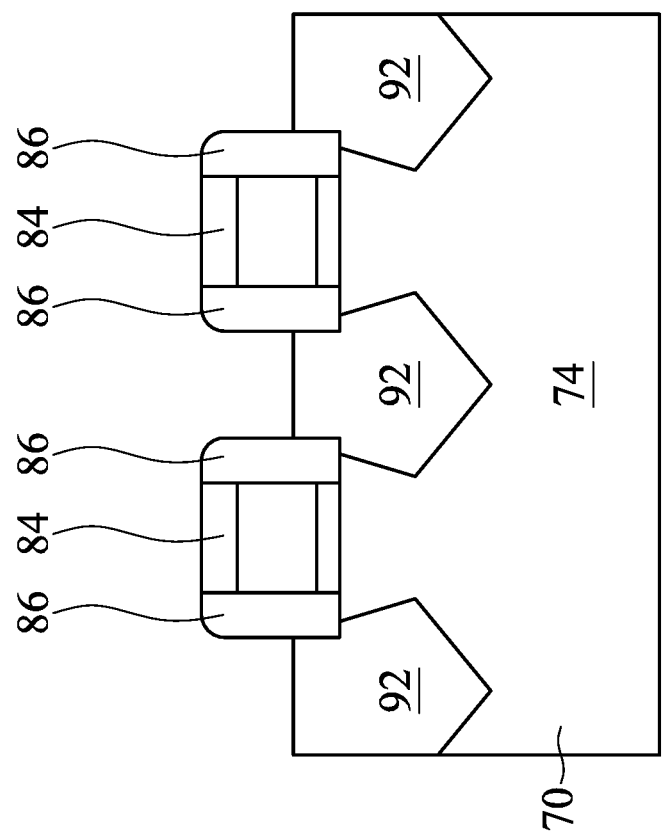

FIGS. 8A and 8B illustrate the formation of epitaxy source/drain regions 92 in the recesses 90. The epitaxy source/drain regions 92 may include or be silicon germanium ($Si_xGe_{1-x}$, where x can be between approximately 0 and 100), silicon carbide, silicon phosphorus, silicon carbon phosphorus, pure or substantially pure germanium, a III-V compound semiconductor, a II-VI compound semiconductor, or the like. For example, materials for forming a III-V compound semiconductor include InAs, AlAs, GaAs, InP, GaN, InGaAs, InAlAs, GaSb, AlSb, AlP, GaP, and the like. The epitaxy source/drain regions 92 may be formed in the recesses 90 by epitaxially growing a material in the recesses 90, such as by metal-organic CVD (MOCVD), molecular beam epitaxy (MBE), liquid phase epitaxy (LPE), vapor phase epitaxy (VPE), selective epitaxial growth (SEG), the like, or a combination thereof. As illustrated in FIGS. 8A and 8B, due to blocking by the isolation regions 78, epitaxy source/drain regions 92 are first grown vertically in recesses 90, during which time the epitaxy source/drain regions 92 do not grow horizontally. After the recesses 90 between the isolation regions 78 are fully filled, the epitaxy source/drain regions 92 may grow both vertically and horizontally to form facets, which may correspond to crystalline planes of the semiconductor substrate 70. In some examples, different materials are used for epitaxy source/drain regions for p-type devices and n-type devices. Appropriate masking during the recessing or epitaxial growth may permit different materials to be used in different devices.

A person having ordinary skill in the art will also readily understand that the recessing and epitaxial growth of FIGS. 7A-B and 8A-B may be omitted, and that source/drain regions may be formed by implanting dopants into the fins 74 using the dummy gate stacks and gate spacers 86 as masks. In some examples where epitaxy source/drain regions 92 are implemented, the epitaxy source/drain regions 92 may also be doped, such as by in situ doping during epitaxial growth and/or by implanting dopants into the epitaxy source/drain regions 92 after epitaxial growth. Example dopants for the source/drain regions can include or be, for example, boron for a p-type device and phosphorus or arsenic for an n-type device, although other dopants may be used. The epitaxy source/drain regions 92 (or other source/drain region) may have a dopant concentration in a range from about $10^{19}$ cm$^{-3}$ to about $10^{21}$ cm$^{-3}$. Hence, a source/drain region may be delineated by doping (e.g., by implantation and/or in situ during epitaxial growth, if appropriate) and/or by epitaxial growth, if appropriate, which may further delineate the active area in which the source/drain region is delineated.

Figure 9A:
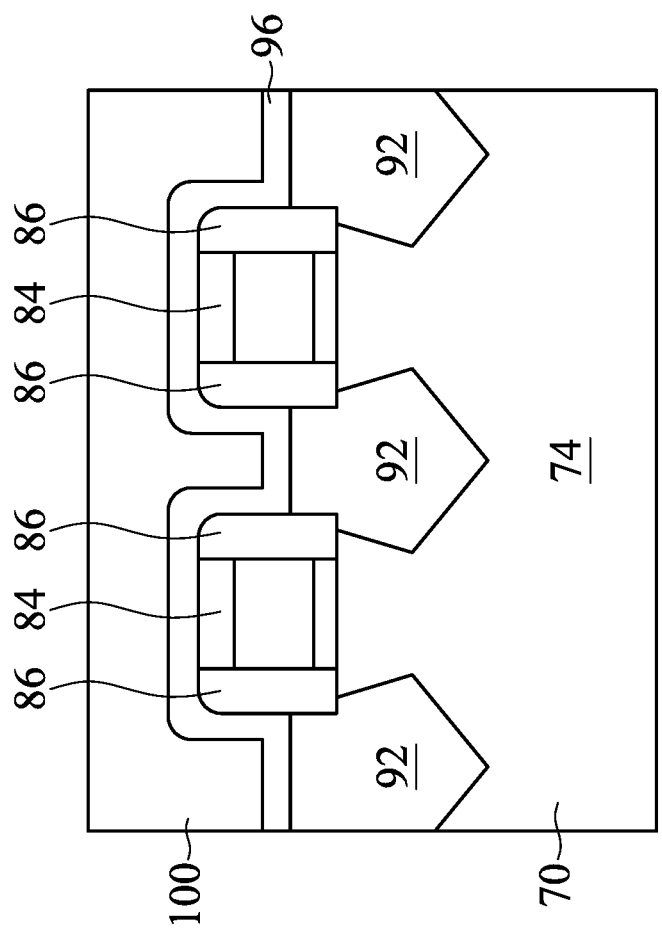
Figure 9B:
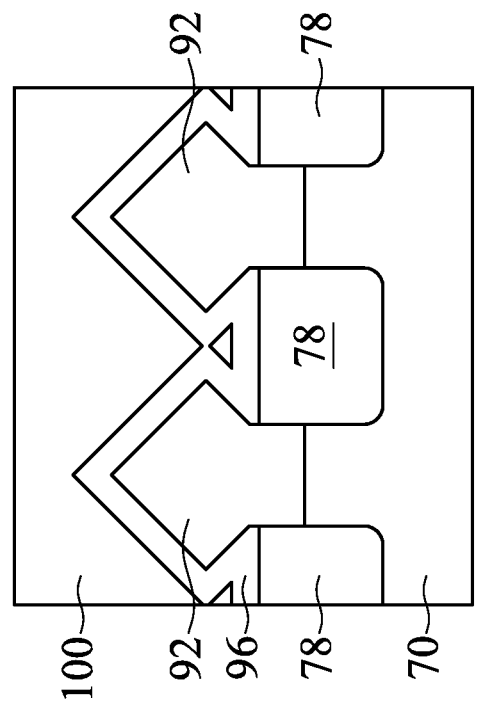

FIGS. 9A and 9B illustrate the formation of a contact etch stop layer (CESL) 96 and a first interlayer dielectric (ILD) 100 over the CESL 96. Generally, an etch stop layer can provide a mechanism to stop an etch process when forming, e.g., contacts or vias. An etch stop layer may be formed of a dielectric material having a different etch selectivity from adjacent layers or components. The CESL 96 is conformally deposited on surfaces of the epitaxy source/drain regions 92, sidewalls and top surfaces of the gate spacers 86, top surfaces of the mask 84, and top surfaces of the isolation regions 78. The CESL 96 may comprise or be silicon nitride, silicon carbon nitride, silicon carbon oxide, carbon nitride, the like, or a combination thereof, and may be deposited by CVD, PECVD, ALD, or another deposition technique. The first ILD 100 may comprise or be silicon dioxide, a low-k dielectric material (e.g., a material having a dielectric constant lower than silicon dioxide), such as silicon oxynitride, phosphosilicate glass (PSG), borosilicate glass (BSG), borophosphosilicate glass (BPSG), undoped silicate glass (USG), fluorinated silicate glass (FSG), organosilicate glasses (OSG), SiO$_x$C$_y$, Spin-On-Glass, Spin-On-Polymers, silicon carbon material, a compound thereof, a composite thereof, the like, or a combination thereof. The first ILD 100 may be deposited by spin-on, CVD, FCVD, PECVD, PVD, or another deposition technique.

Figure 10B:
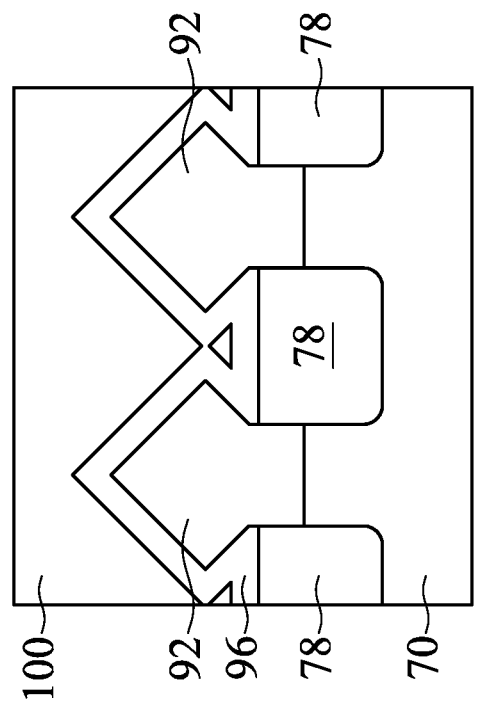
Figure 10A:
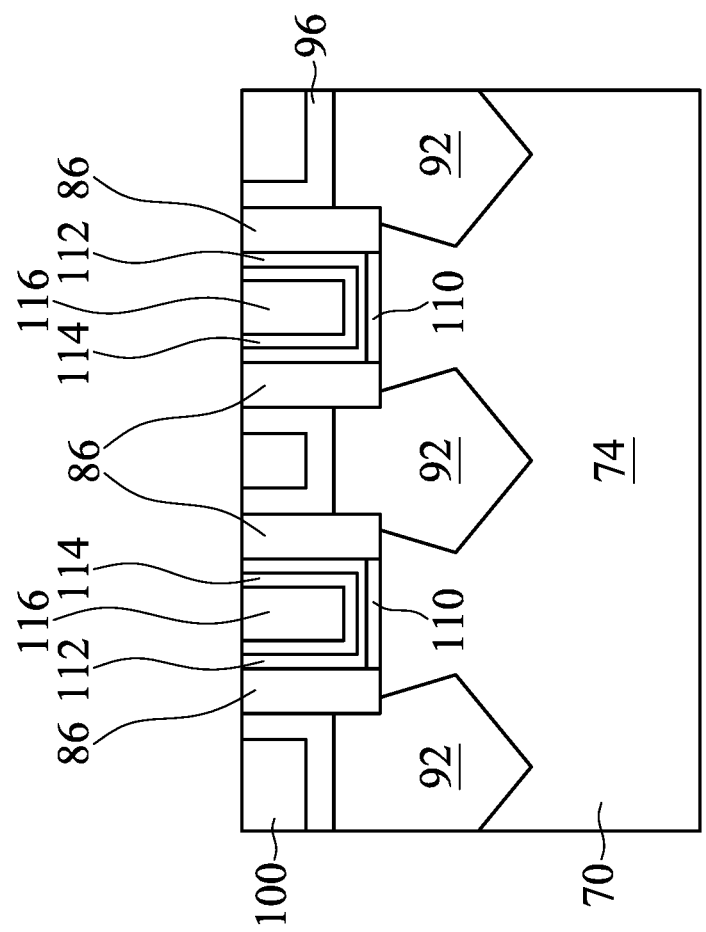

FIGS. 10A and 10B illustrate the replacement of dummy gate stacks with replacement gate structures. The first ILD 100 and CESL 96 are formed with top surfaces coplanar with top surfaces of the dummy gates 82. A planarization process, such as a CMP, may be performed to level the top surface of the first ILD 100 and CESL 96 with the top surfaces of the dummy gates 82. The CMP may also remove the masks 84 (and, in some instances, upper portions of the gate spacers 86) on the dummy gates 82. Accordingly, top surfaces of the dummy gates 82 are exposed through the first ILD 100 and the CESL 96.

With the dummy gates 82 exposed through the first ILD 100 and the CESL 96, the dummy gates 82 are removed, such as by one or more etch processes. The dummy gates 82 may be removed by an etch process selective to the dummy gates 82, wherein the interfacial dielectrics 80 act as etch stop layers, and subsequently, the interfacial dielectrics 80 can optionally be removed by a different etch process selective to the interfacial dielectrics 80. The etch processes can be, for example, a RIE, NBE, a wet etch, or another etch process. Recesses are formed between gate spacers 86 where the dummy gate stacks are removed, and channel regions of the fins 74 are exposed through the recesses.

The replacement gate structures are formed in the recesses formed where the dummy gate stacks were removed. The replacement gate structures each include, as illustrated, an interfacial dielectric 110, a gate dielectric layer 112, one or more optional conformal layers 114, and a gate electrode 116. The interfacial dielectric 110 is formed on sidewalls and top surfaces of the fins 74 along the channel regions. The interfacial dielectric 110 can be, for example, the interfacial dielectric 80 if not removed, an oxide (e.g., silicon oxide) formed by thermal or chemical oxidation of the fin 74, and/or an oxide (e.g., silicon oxide), nitride (e.g., silicon nitride), and/or another dielectric layer formed by CVD, ALD, molecular beam deposition (MBD), or another deposition technique.

The gate dielectric layer 112 can be conformally deposited in the recesses where dummy gate stacks were removed (e.g., on top surfaces of the isolation regions 78, on the interfacial dielectric 110, and sidewalls of the gate spacers 86) and on the top surfaces of the first ILD 100, the CESL 96, and gate spacers 86. The gate dielectric layer 112 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate dielectric layer 112 can be deposited by ALD, PECVD, MBD, or another deposition technique.

Then, the one or more optional conformal layers 114 can be conformally (and sequentially, if more than one) deposited on the gate dielectric layer 112. The one or more optional conformal layers 114 can include one or more barrier and/or capping layers and one or more work-function tuning layers. The one or more barrier and/or capping layers can include a nitride, silicon nitride, carbon nitride, and/or aluminum nitride of tantalum and/or titanium; a nitride, carbon nitride, and/or carbide of tungsten; the like; or a combination thereof; and may be deposited by ALD, PECVD, MBD, or another deposition technique. The one or more work-function tuning layer may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof; and may be deposited by ALD, PECVD, MBD, or another deposition technique. In some examples, a capping layer (e.g., a TiN layer) is formed conformally on the gate dielectric layer 112; a barrier layer (e.g., a TaN layer) is formed conformally on the capping layer; and one or more work-function tuning layers are sequentially formed conformally on the barrier layer.

A layer for the gate electrodes 116 is formed over the one or more optional conformal layers 114 (e.g., over the one or more work-function tuning layers), if implemented, and/or the gate dielectric layer 112. The layer for the gate electrodes 116 can fill remaining portions of recesses where the dummy gate stacks were removed. The layer for the gate electrodes 116 may be or comprise a metal such as tungsten, cobalt, aluminum, ruthenium, copper, multi-layers thereof, a combination thereof, or the like. The layer for the gate electrodes 116 can be deposited by ALD, PECVD, MBD, PVD, or another deposition technique. Portions of the layer for the gate electrodes 116, one or more optional conformal layers 114, and gate dielectric layer 112 above the top surfaces of the first ILD 100, the CESL 96, and gate spacers 86 are removed. For example, a planarization process, like a CMP, may remove the portions of the layer for the gate electrodes 116, one or more optional conformal layers 114, and gate dielectric layer 112 above the top surfaces of the first ILD 100, the CESL 96, and gate spacers 86. Each replacement gate structure comprising the gate electrode 116, one or more optional conformal layers 114, gate dielectric layer 112, and interfacial dielectric 110 may therefore be formed as illustrated in FIG. 10A.

FIGS. 11A and 11B illustrate the modification of exposed dielectric surfaces to have modified surfaces 120. As illustrated, the top surfaces of the first ILD 100, CESL 96, gate spacers 86, and gate dielectric layers 112, which are exposed, are modified to have the modified surfaces 120. The modification of exposed dielectric surfaces can be omitted in some examples.

Generally, in semiconductor processing, dielectric surfaces, unless treated to have different properties, are terminated with hydroxyl groups (OH), such as silicon bonded with a hydroxyl group (Si—OH). Si—OH is generally hydrophilic. In some examples, such a hydrophilic surface is modified to be hydrophobic.

In some examples, the modification includes exposing the dielectric surfaces to a reactant/adsorbate chemical to modify the dielectric surfaces to be hydrophobic. The reactant/adsorbate chemical can react with and/or can be adsorbed onto the dielectric surfaces to modify the dielectric surfaces. In some examples, the reactant/adsorbate chemical can selectively react with and/or be adsorbed onto the dielectric surfaces while not substantially reacting with or being adsorbed onto metallic surfaces. Metallic surfaces may, in some instances, not react with or adsorb the reactant/adsorbate chemical, while in other instances, may adsorb some of the reactant/adsorbate chemical, which can be desorbed easily. A bonding energy between the reactant/adsorbate chemical and the dielectric surfaces can be relatively small, while a bonding energy between the reactant/adsorbate chemical and the metallic surfaces can be relatively large. Hence, the reactant/adsorbate chemical may react and bond with the dielectric surfaces while not significantly reacting with and/or being adsorbed by the metallic surfaces. For example, the reactant/adsorbate chemical can selectively react with the dielectric surfaces of the first ILD 100, CESL 96, gate spacers 86, and gate dielectric layer 112, while not substantially reacting with or being adsorbed by the metallic surfaces of the one or more optional conformal layers 114 and gate electrodes 116.

For example, surfaces of conductive TiN, TaN, AlTiC, AlTiO, AlTiN, and/or the like, which may be implemented as the one or more optional conformal layers 114 in the replacement gate structure, are examples of metallic surfaces, and surfaces of insulating $HfO_2$, which may be implemented as the gate dielectric layer 112, are not metallic surfaces.

The reactant/adsorbate chemical includes a hydrophobic functional group and a mechanism for easily reacting with a dielectric surface that does not generally react with a metallic surface or, if capable of being adsorbed onto a metallic surface, can be easily desorbed from the metallic surface. For example, the hydrophobic functional group can include a hydrocarbon chain (e.g., $-C_xH_{2x+1}$), such as $-CH_3$, $-C_2H_5$, etc., and the mechanism for easily reacting with a dielectric surface can include silicon (Si). Some example reactant/adsorbate chemicals can be of the general form $R-Si(CH_3)_3$. More specific example reactant/adsorbate chemicals include tetramethylsilane ($Si(CH_3)_4$), N,N-Dimethyltrimethylsilylamine ($(CH_3)_2-N-Si-(CH_3)_3$), and/or another silane derivative with one or more hydrophobic functional groups.

The dielectric surfaces can be exposed to the reactant/adsorbate chemical using various processes. The exposure can be a dry (e.g., gas and/or plasma) process or a wet process. In an example wet process, the semiconductor substrate 70 on which the dielectric surfaces are formed is immersed into a bath comprising the chemical reactant at a temperature in a range from 20° C. (e.g., room temperature) to 400° C., and more particularly, from about 20° C. to about 80° C., for a duration in a range from about 5 seconds to about 600 seconds. The bath can further be a mixture comprising the chemical reactant and, for example, deionized water (DIW), isopropyl alcohol (IPA), the like, or a combination thereof. For example, a mixture can be $R-Si(CH_3)_3$, IPA, and DIW at a ratio in a range of (50% to 100% by parts):(0% to 70% by parts):(0% to 70% by parts) ($R-Si(CH_3)_3$:IPA:DIW).

An example dry process can be implemented by a CVD, ALD, or another process. The dry process can implement a plasma or may not implement a plasma. In an example CVD process without a plasma, the reactant/adsorbate chemical may be gaseous and mixed with an inert carrier gas, such as argon, hydrogen, or another carrier gas. A flow rate of the reactant/adsorbate chemical gas can be in a range from about 10 sccm to about 1,000 sccm, and a flow rate of the inert carrier gas can be in a range from about 10 sccm to about 3,000 sccm. A ratio of the flow rate of the reactant/adsorbate chemical gas to the flow rate of the inert carrier gas can be in a range from about 0.90:0.10 to about 0.05:0.95. A pressure of the example CVD process can be in a range from about 0.1 Torr to about 40 Torr. A temperature of the example CVD process can be in a range from 20° C. (e.g., room temperature) to 400° C., and more particularly, from about 50° C. to about 300° C. A duration of the example CVD process can be in a range from about 5 seconds to about 300 seconds.

In a plasma process, the plasma can be a direct plasma or a remote plasma. In an example CVD process with a direct plasma (e.g., PECVD), the reactant/adsorbate chemical may be gaseous and mixed with an inert carrier gas, such as argon, hydrogen, helium, or another carrier gas. A flow rate of the reactant/adsorbate chemical gas can be in a range from about 10 sccm to about 1,000 sccm, and a flow rate of the inert carrier gas can be in a range from about 10 sccm to about 3,000 sccm. A ratio of the flow rate of the reactant/adsorbate chemical gas to the flow rate of the inert carrier gas can be in a range from about 0.90:0.10 to about 0.05:0.95. A pressure of the example CVD process with a direct plasma can be in a range from about 0.1 Torr to about 40 Torr. The direct plasma of the CVD process may be a capacitively coupled plasma (CCP). The plasma generator of the CVD process with a direct plasma can be operated with a power in a range from about 10 W to about 1,000 W and with a frequency in a range from about 13.56 MHz to about 40 MHz. The substrate holder of the CVD process may be unbiased. A temperature of the example CVD process with a direct plasma can be in a range from 20° C. (e.g., room temperature) to 400° C., and more particularly, from about 50° C. to about 300° C. A duration of the example CVD process with a direct plasma can be in a range from about 5 seconds to about 300 seconds.

In an example CVD process with a remote plasma (e.g., remote plasma enhanced CVD (RPECVD)), the reactant/adsorbate chemical may be gaseous and mixed with an inert carrier gas, such as argon, hydrogen, helium, or another carrier gas. A flow rate of the reactant/adsorbate chemical gas can be in a range from about 10 sccm to about 1,000 sccm, and a flow rate of the inert carrier gas can be in a range from about 10 sccm to about 3,000 sccm. A ratio of the flow rate of the reactant/adsorbate chemical gas to the flow rate of the inert carrier gas can be in a range from about 0.90:0.10 to about 0.05:0.95. A pressure of the example CVD process with a remote plasma can be in a range from about 0.1 Torr to about 40 Torr. The remote plasma of the CVD process may be a CCP. The plasma generator of the CVD process with a remote plasma can be operated with a power in a range from about 10 W to about 1,000 W and with a frequency in a range from about 13.56 MHz to about 40 MHz. The substrate holder of the CVD process may be unbiased. A temperature of the example CVD process with a remote plasma can be in a range from 20° C. (e.g., room temperature) to 400° C., and more particularly, from about 50° C. to about 300° C. A duration of the example CVD process with a remote plasma can be in a range from about 5 seconds to about 300 seconds.

Since the reactant/adsorbate chemical reacts with the dielectric surfaces (e.g., as opposed to reacting with another reactant/adsorbate chemical supplied to the process), the formation of the modified surfaces 120 can be reaction limited based on the reaction sites available on the dielectric surfaces. Hence, the modified surfaces 120 can be or include hydrophobic functional groups terminating the dielectric surfaces and/or a monolayer of the hydrophobic functional groups (e.g., a self-aligned monolayer (SAM)). For example, where the dielectric surfaces include or are Si—OH, the Si—OH of the dielectric surfaces can react with the reactant/adsorbate chemical, which is R–Si–$(CH_3)_3$ in this example, to form a modified surface that is or includes Si–O–Si–$(CH_3)_3$, where the H from the Si—OH and R functional group from the R–Si–$(CH_3)_3$ are byproducts from the reaction that are removed from the surface, such as by purging gas in a dry process and/or rinsing in a wet process. In this example, the —$CH_3$ groups cause the modified surfaces 120 to be hydrophobic.

The bonding energy between the species Si—$(CH_3)_3$ in this example and the metallic surfaces of the gate electrodes 116 and one or more optional conformal layers 114 is larger than the bonding energy between the species Si—$(CH_3)_3$ and oxygen-containing dielectric surfaces. Hence, the species Si—$(CH_3)_3$ bonds to the dielectric surfaces to form the modified surfaces 120 while not significantly bonding with the metallic surfaces.

In some examples, a thermal treatment may be performed, which can remove the reactant/adsorbate chemical that was adsorbed on the metallic surfaces. For example, the thermal treatment can cause the reactant/adsorbate chemical to be desorbed and/or to evaporate from the metallic surfaces. In some examples, the thermal treatment includes a furnace process, rapid thermal anneal (RTA), or the like. A thermal treatment may be performed in an active gas, such as hydrogen ($H_2$), ammonia ($NH_3$), or the like, at a temperature in a range from about 50° C. to about 400° C., such as about 200° C., for a duration in a range from about 30 seconds to 1 minute. Other thermal treatments may be implemented.

Figure 12B:
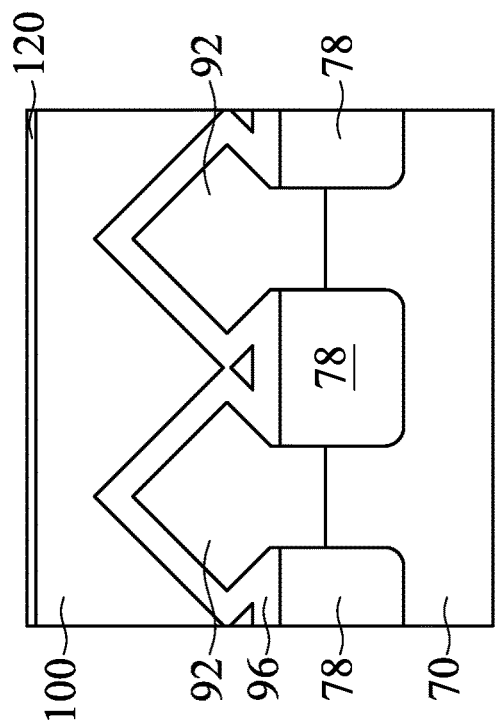
Figure 12A:
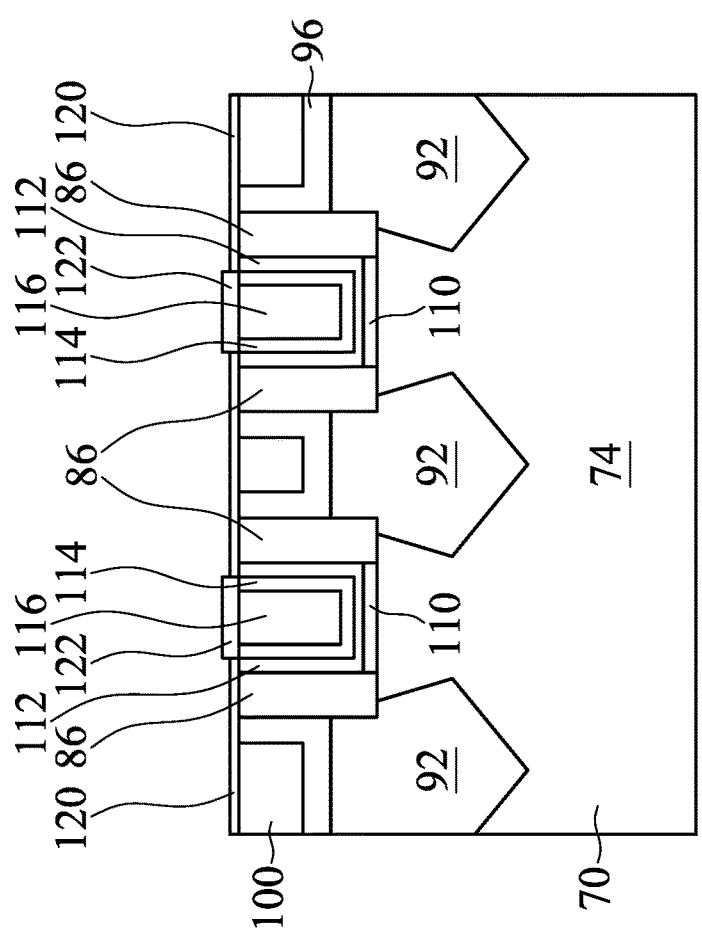

FIGS. 12A and 12B illustrate the formation of capping layers 122 (e.g., a metal cap) on metallic surfaces, such as surfaces of the one or more optional conformal layers 114 and gate electrodes 116. The capping layers 122 can be formed using a selective deposition process that deposits the capping layers 122 on the metallic surfaces but does not significantly deposit on dielectric surfaces.

In some examples, the selective deposition is a fluorine-free tungsten deposition, and hence, the capping layers 122 can be free of fluorine. In some examples, the selective deposition process, which further is a fluorine-free tungsten deposition, is an ALD process that uses a hydrogen ($H_2$) precursor and a tungsten chloride precursor. The tungsten chloride precursor can be tungsten (V) chloride ($WCl_5$), tungsten (VI) chloride ($WCl_6$), another tungsten chloride, or a combination thereof. In some examples, a cycle of the ALD process can include sequentially flowing the tungsten chloride precursor, purging the tungsten chloride precursor, flowing the hydrogen precursor, and purging the hydrogen precursor. In some examples, a cycle of the ALD process can include sequentially flowing the hydrogen precursor, purging the hydrogen precursor, flowing the tungsten chloride precursor, and purging the tungsten chloride precursor. The ALD process can include performing the cycle any number of times, such as in a range from about 150 cycles to about 320 cycles. Flowing the tungsten chloride can also include flowing a carrier gas, such as argon, nitrogen, helium, or the like. A ratio of the flow rate of the tungsten chloride to the flow rate of the carrier gas can be in a range from about 0.90:0.10 to about 0.05:0.95. A flow rate of the mixture of the tungsten chloride precursor and the carrier gas can be in a range from about 10 sccm to about 1,000 sccm, such as about 500 sccm. A flow rate of the tungsten chloride precursor can be in a range from about 10 sccm to about 1,000 sccm, and a flow rate of the carrier gas can be in a range from about 10 sccm to about 3,000 sccm. A flow rate of the hydrogen precursor can be in a range from about 100 sccm to about 10,000 sccm, such as about 7,000 sccm. A pressure of the ALD process can be in a range from about 0.1 Torr to about 40 Torr, such as about 20 Torr. A temperature of the ALD process can be in a range from about 75° C. to about 500° C., such as about 450° C.

It is believed that the high electron mobility of metallic surfaces (e.g., TiN, TaN, AlTiC, AlTiO, AlTiN, W, etc.) permits the tungsten chloride to react more easily with the metallic surfaces than dielectric surfaces, which have a lower electron mobility. In the above-described ALD process, it is believed that tungsten chloride reacts with the metallic surface to form a bond between a material of the metallic surface and tungsten chloride ($WCl_x$) and to form a bond between a material of the metallic surface and chlorine that is released from the tungsten chloride precursor. When the hydrogen precursor is flowed, it is believed that the hydrogen reacts with chlorine bonded with the metallic surface and/or chlorine of the tungsten chloride ($WCl_x$) bonded with the metallic surface to form hydrochloric acid (HCl), which is formed as a gaseous byproduct and purged in the flowing and purging of the hydrogen precursor. Tungsten can therefore be formed on the metallic surfaces. The formed tungsten may include residual chlorine, such as less than about 1%.

In other examples, other processes may be implemented to form the capping layers 122. For example, any process that permits the selective deposition of a metal on a metallic surface can be implemented, such as a CVD, ALD, or another deposition technique that can selectively deposit, for example, cobalt, manganese, tungsten, or another metal or metallic material. An example is selective deposition of cobalt by a CVD process. The CVD process can use a cobalt carbonyl precursor mixed with an inert carrier gas. A ratio of the flow rate of the cobalt carbonyl to the flow rate of the carrier gas can be in a range from about 0.90:0.10 to about 0.05:0.95. A flow rate of the mixture of the cobalt carbonyl and the carrier gas can be in a range from about 10 sccm to about 1,000 sccm. A flow rate of the cobalt carbonyl precursor can be in a range from about 10 sccm to about 1,000 sccm, and a flow rate of the carrier gas can be in a range from about 10 sccm to about 3,000 sccm. A pressure of the CVD process can be in a range from about 0.1 Torr to about 40 Torr, such as about 20 Torr. A temperature of the CVD process can be in a range from about 20° C. to about 400° C.

In examples implementing the modified surfaces 120, with the modified surfaces 120 present during the deposition of the capping layers 122, precursors, byproducts, etc. of the deposition process for forming the capping layers 122 can be repelled by the electrostatic force of the hydrophobic modified surfaces 120, which can improve the selectivity of the deposition process and reduce damage to dielectric layers, such as a low-k dielectric of the first ILD 100. The improved selectivity and reduced damage can reduce defects and reduce parasitic leakage caused by damage to the dielectric layers.

As illustrated in FIG. 12A, the capping layers 122 are formed on metallic surfaces of the replacement gate structure (e.g., top surfaces or the one or more optional conformal layers 114 (e.g., TiN, TaN, AlTiC, AlTiO, AlTiN, etc.), and gate electrodes 116 (e.g., W, etc.)) that are formed by the planarization process (e.g., CMP) described with respect to FIGS. 10A and 10B. The planarization process of FIGS. 10A and 10B formed top surfaces of the first ILD 100, CESL 96, and gate spacers 86 (which surfaces may be modified to be the modified surfaces 120) to be coplanar with the top surfaces of the gate dielectric layers 112 (which may also be modified to the modified surfaces 120), one or more optional conformal layers 114, and gate electrodes 116. Hence, the capping layers 122 may have respective top surfaces at a level above the top surfaces of the first ILD 100, CESL 96, gate spacers 86, and gate dielectric layers 112, which surfaces may be modified to be the modified surfaces 120. The capping layers 122 may have a thickness in a range from about 30 Å to about 50 Å.

Figure 13B:
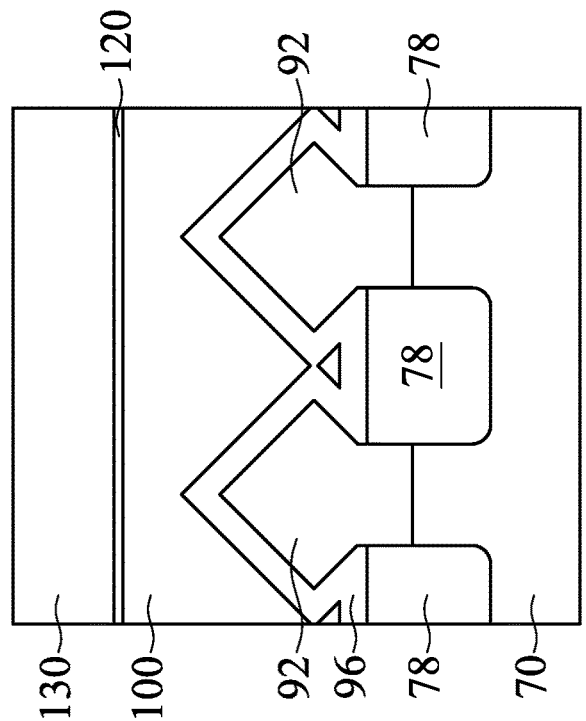
Figure 13A:
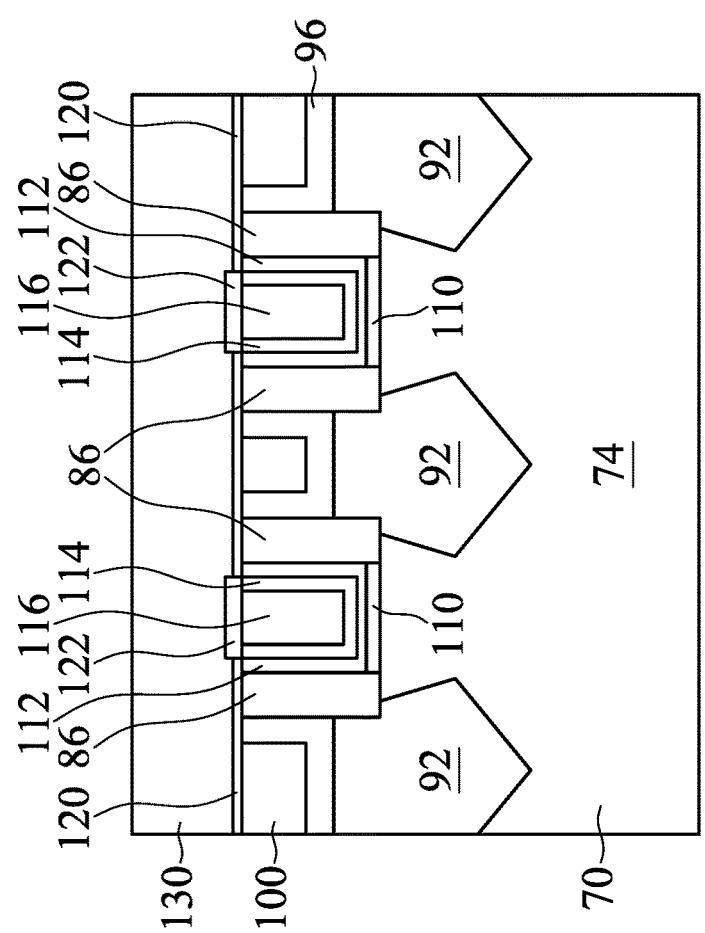

FIGS. 13A and 13B illustrate the formation of a second ILD 130 over the modified surfaces 120 (if implemented, and/or over the first ILD 100, gate spacers 86, CESL 96, and gate dielectric layers 112) and capping layers 122. Although not illustrated, in some examples, an etch stop layer may be deposited over the modified surfaces 120 (if implemented, and/or over the first ILD 100, gate spacers 86, CESL 96, and gate dielectric layers 112) and capping layers 122, and the second ILD 130 may be deposited over the ESL. If implemented, the ESL may comprise or be silicon nitride, silicon carbon nitride, silicon carbon oxide, carbon nitride, the like, or a combination thereof, and may be deposited by CVD, PECVD, ALD, or another deposition technique. The second ILD 130 may comprise or be silicon dioxide, a low-k dielectric material, such as silicon oxynitride, PSG, BSG, BPSG, USG, FSG, OSG, SiO$_x$C$_y$, Spin-On-Glass, Spin-On-Polymers, silicon carbon material, a compound thereof, a composite thereof, the like, or a combination thereof. The second ILD 130 may be deposited by spin-on, CVD, FCVD, PECVD, PVD, or another deposition technique.

Figure 14B:
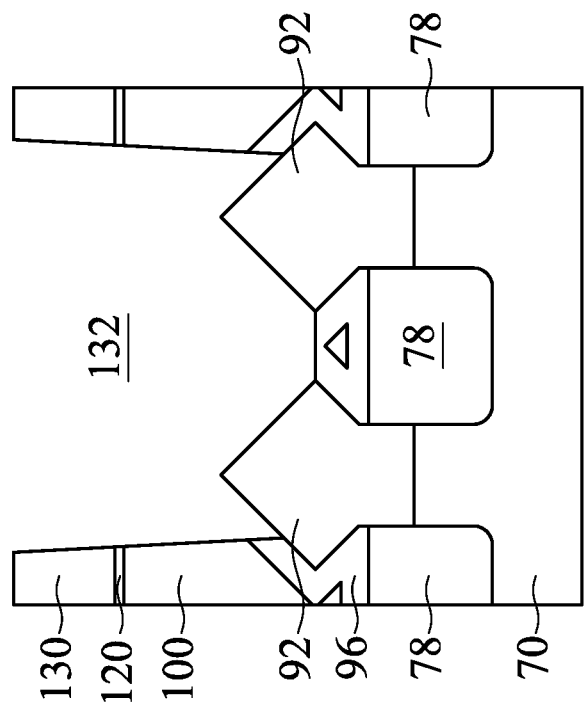
Figure 14A:
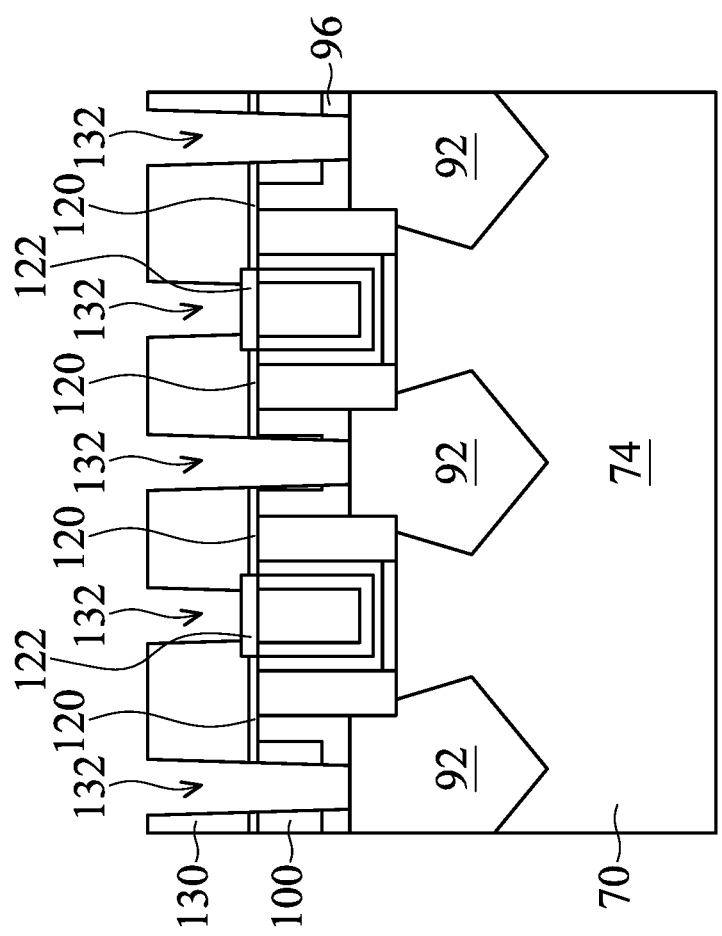

FIGS. 14A and 14B illustrate the formation of respective openings 132 through the second ILD 130, the first ILD 100 and its modified surface 120 (if implemented), and the CESL 96 to the epitaxy source/drain regions 92 to expose at least portions of the epitaxy source/drain regions 92, and through the second ILD 130 to expose at least portions of the capping layers 122. The second ILD 130, the first ILD 100, and the CESL 96 may be patterned with the openings 132, for example, using photolithography and one or more etch processes.

Figure 15B:
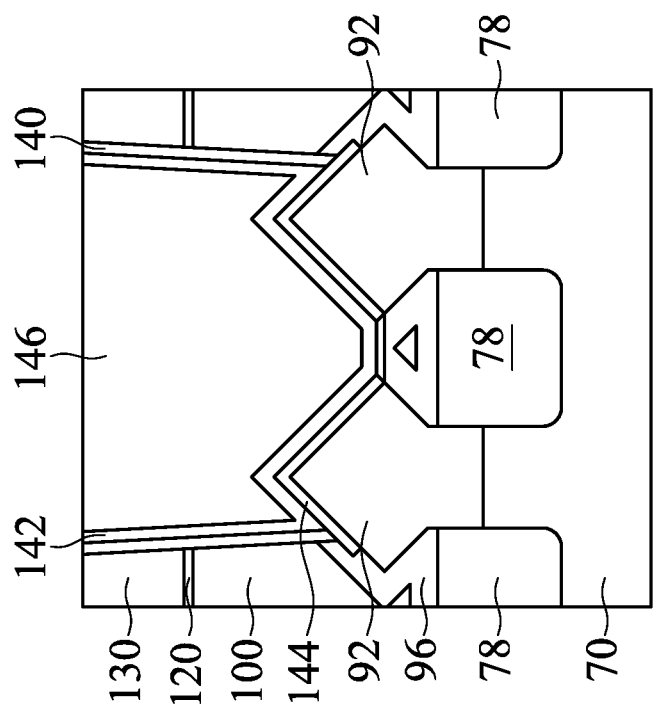
Figure 15A:
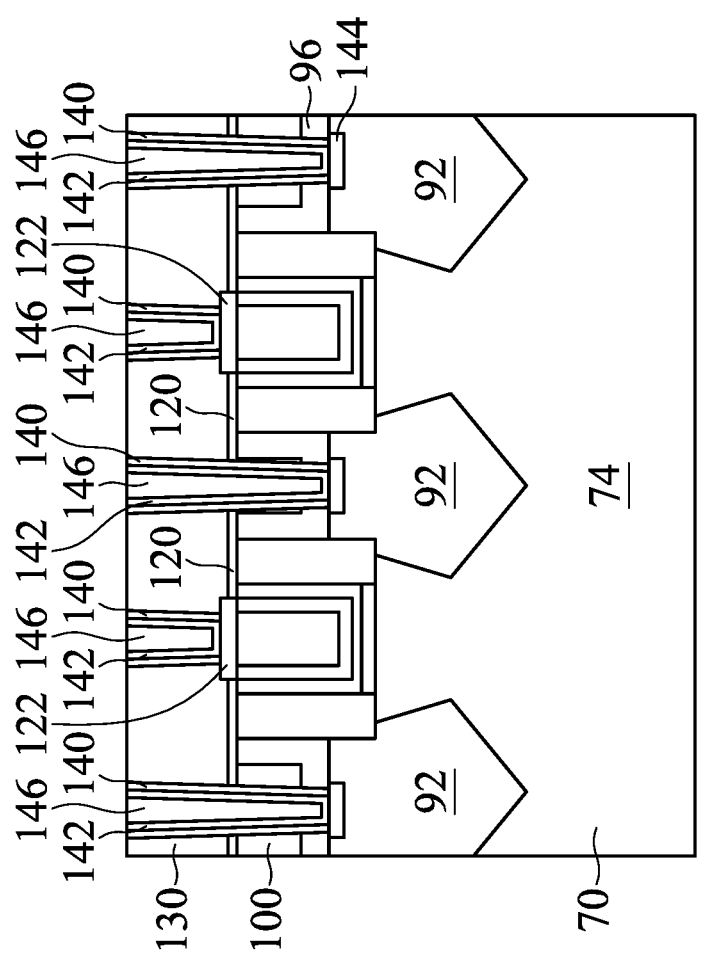

FIGS. 15A and 15B illustrate the formation of respective conductive features in the openings 132 to the epitaxy source/drain regions 92 and to the capping layers 122. Each conductive feature includes, in the illustrated example, an adhesion layer 140, a barrier layer 142 on the adhesion layer 140, and conductive fill material 146 on the barrier layer 142, for example. In some examples, each conductive feature to the epitaxy source/drain regions 92 may further include a silicide region 144 on the epitaxy source/drain region 92, as illustrated.

The adhesion layer 140 can be conformally deposited in the openings 132 (e.g., on sidewalls of the openings 132, exposed surfaces of the epitaxy source/drain regions 92, and exposed surfaces of the capping layers 122) and over the second ILD 130. The adhesion layer 140 may be or comprise titanium, tantalum, the like, or a combination thereof, and may be deposited by ALD, CVD, PVD, or another deposition technique. The barrier layer 142 can be conformally deposited on the adhesion layer 140, such as in the openings 132 and over the second ILD 130. The barrier layer 142 may be or comprise titanium nitride, titanium oxide, tantalum nitride, tantalum oxide, the like, or a combination thereof, and may be deposited by ALD, CVD, or another deposition technique. In some examples, at least a portion of the adhesion layer 140 can be treated to form the barrier layer 142. For example, a nitridation process, such as including a nitrogen plasma process, can be performed on the adhesion layer 140 to convert the at least the portion of the adhesion layer 140 into the barrier layer 142. In some examples, the adhesion layer 140 can be completely converted such that no adhesion layer 140 remains and the barrier layer 142 is an adhesion/barrier layer, while in other examples, a portion of the adhesion layer 140 remains unconverted such that the portion of the adhesion layer 140 remains with the barrier layer 142 on the adhesion layer 140.

Silicide regions 144 may be formed on the epitaxy source/drain regions 92 by reacting upper portions of the epitaxy source/drain regions 92 with the adhesion layer 140, and possibly, the barrier layer 142. An anneal can be performed to facilitate the reaction of the epitaxy source/drain regions 92 with the adhesion layer 140 and/or barrier layer 142.

The conductive fill material 146 can be deposited on the barrier layer 142 and fill the openings 132. The conductive fill material 146 may be or comprise tungsten, cobalt, copper, ruthenium, aluminum, gold, silver, alloys thereof, the like, or a combination thereof, and may be deposited by CVD, ALD, PVD, or another deposition technique. After the conductive fill material 146 is deposited, excess conductive fill material 146, barrier layer 142, and adhesion layer 140 may be removed by using a planarization process, such as a CMP, for example. The planarization process may remove excess conductive fill material 146, barrier layer 142, and adhesion layer 140 from above a top surface of the second ILD 130. Hence, top surfaces of the conductive features and the second ILD 130 may be coplanar. The conductive features may be or may be referred to as contacts, plugs, etc.

Although FIGS. 15A and 15B illustrate the conductive features to the epitaxy source/drain regions 92 and the conductive features to the capping layers 122 being formed simultaneously, the respective conductive features may be formed separately and sequentially. For example, the openings 132 to the epitaxy source/drain regions 92 may be first formed, as in FIGS. 14A and 14B, and filled to form conductive features to the epitaxy source/drain regions 92, as in FIGS. 15A and 15B. Then, the openings 132 to the capping layers 122 may be formed, as in FIGS. 14A and 14B, and filled to form conductive features to the capping layers 122, as in FIGS. 15A and 15B. Another order of processing may be implemented.

FIGS. 16A-B through 19A-B are cross-sectional views of respective intermediate structures at intermediate stages in another example process of forming a semiconductor device in accordance with some embodiments. In this example process, processing proceeds as described with respect to FIGS. 2A-B through 10A-B and resumes at FIGS. 16A-B.

FIGS. 16A and 16B illustrate the recessing of metallic components of the replacement gate structures, such as the one or more optional conformal layers 114 and the gate electrodes 116. The recessing forms recesses 118 where the metallic components were recessed. The recessing can be performed by any suitable etch process and/or cleaning process, such as a process that removes material of the metallic components of the replacement gate structure at a greater rate than, e.g., the first ILD 100, CESL 96, gate spacers 86, and gate dielectric layers 112. The removal process can be a dry (e.g., plasma) process and/or a wet process. A depth of the recesses 118 can be in a range from about 30 Å to about 50 Å.

In some examples, the removal process is a plasma process that uses an oxygen ($O_2$) plasma. The plasma process can be an RIE, ICP, CCP, or the like. Other gases, such as hydrogen ($H_2$), ammonia ($NH_3$), or the like, may be used instead of or in addition to the oxygen in the plasma process. A flow rate of the oxygen gas can be in a range from about 5 sccm to about 500 sccm. A temperature of the plasma process may be in a range from about 20° C. to about 400° C., such as about 200° C. A pressure of the plasma process may be in a range from about 5 mTorr to about 10 Torr, such as about 1.1 Torr. A power of the plasma generator of the plasma process may be in a range from about 100 W to about 40 kW. The substrate holder of the plasma process may be unbiased. A duration of the exposure of the intermediate structure to the plasma of the plasma process can be in a range from about 2 seconds to about 600 seconds.

In some examples, the removal process is a wet process. For example, the wet process can be a standard clean (SC) 1 and/or a SC-2. A temperature of the wet process may be in a range from about 20° C. to about 80° C. A duration of the wet process can be in a range from about 5 seconds to about 600 seconds. Other wet processes, such as using different etchants can be implemented.

FIGS. 17A and 17B illustrate the modification of exposed dielectric surfaces to have modified surfaces 120. The modification may be performed as described above with respect to FIGS. 11A and 11B, and hence, further description here is omitted for brevity. As in FIGS. 11A and 11B, the modification of exposed dielectric surfaces can be omitted in some examples.

The recess 118 causes upper portions of sidewalls of the gate dielectric layer 112 to be exposed to the modification process, and hence, the upper portions of sidewalls of the gate dielectric layer 112 can have modified surfaces 120, as illustrated.

Figure 18B:
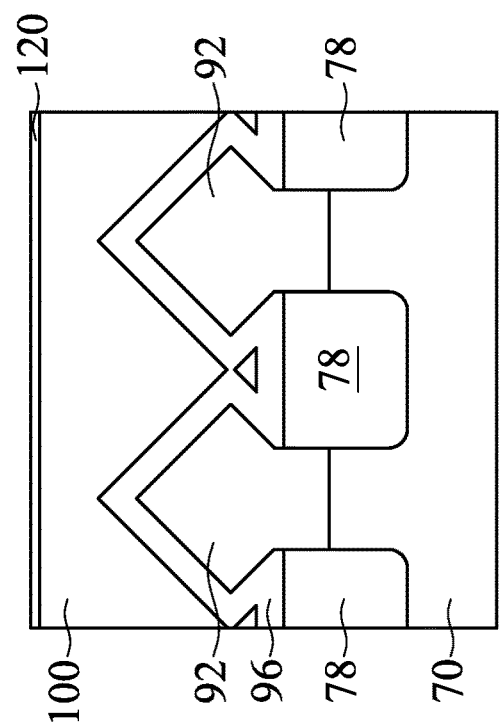
Figure 18A:
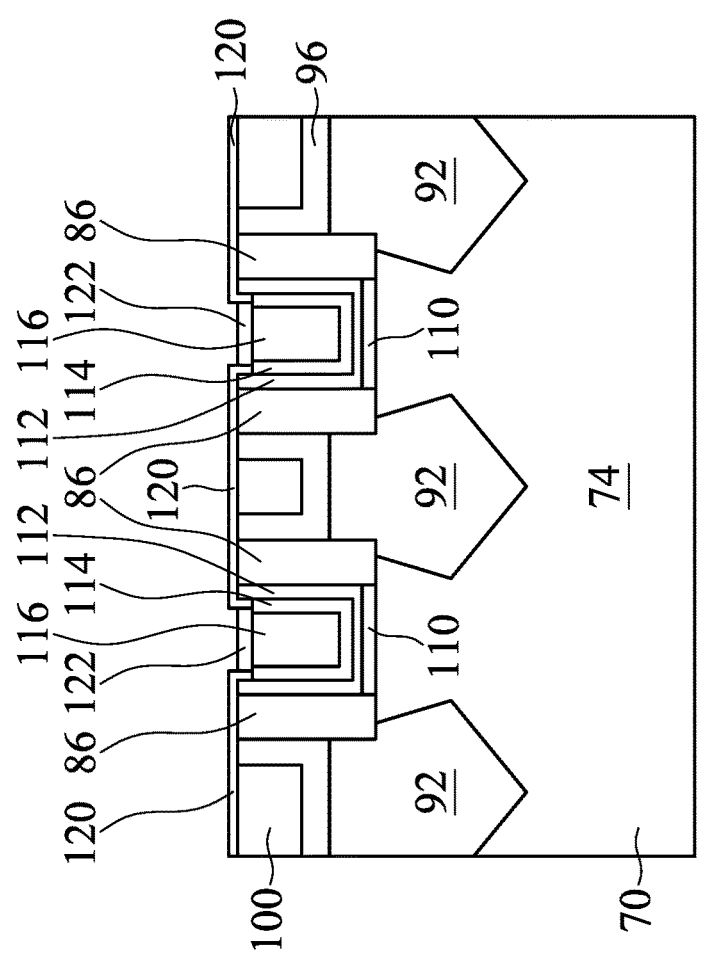

FIGS. 18A and 18B illustrate the formation of capping layers 122 (e.g., a metal cap) on metallic surfaces, such as surfaces of the one or more optional conformal layers 114 and gate electrodes 116 where the replacement gate structures were recessed to form the recesses 118. The formation of the capping layers 122 may be performed as described above with respect to FIGS. 12A and 12B, and hence, further description here is omitted for brevity. In this example, bottom surfaces of the capping layers 122 are below the modified surfaces 120 and/or top surfaces of the first ILD 100, CESL 96, gate spacers 86, and gate dielectric layer 112, and top surfaces of the capping layers 122 can be above, level with, or below the modified surfaces 120 and/or top surfaces of the first ILD 100, CESL 96, gate spacers 86, and gate dielectric layer 112. Further, sidewalls of the capping layers 122 can abut the modified surfaces 120 of the upper portions of the sidewalls of the gate dielectric layer 112, as illustrated, and/or can abut the sidewalls of the gate dielectric layer 112.

FIGS. 19A and 19B illustrate the formation of a second ILD 130 over the modified surfaces 120 (if implemented, and/or over the first ILD 100, gate spacers 86, CESL 96, and gate dielectric layers 112) and capping layers 122. The formation of the second ILD 130 may be performed as described above with respect to FIGS. 13A and 13B, and hence, further description here is omitted for brevity. Processing may then continue as described above with respect to FIGS. 14A-B through 15A-B.

Figure 20:
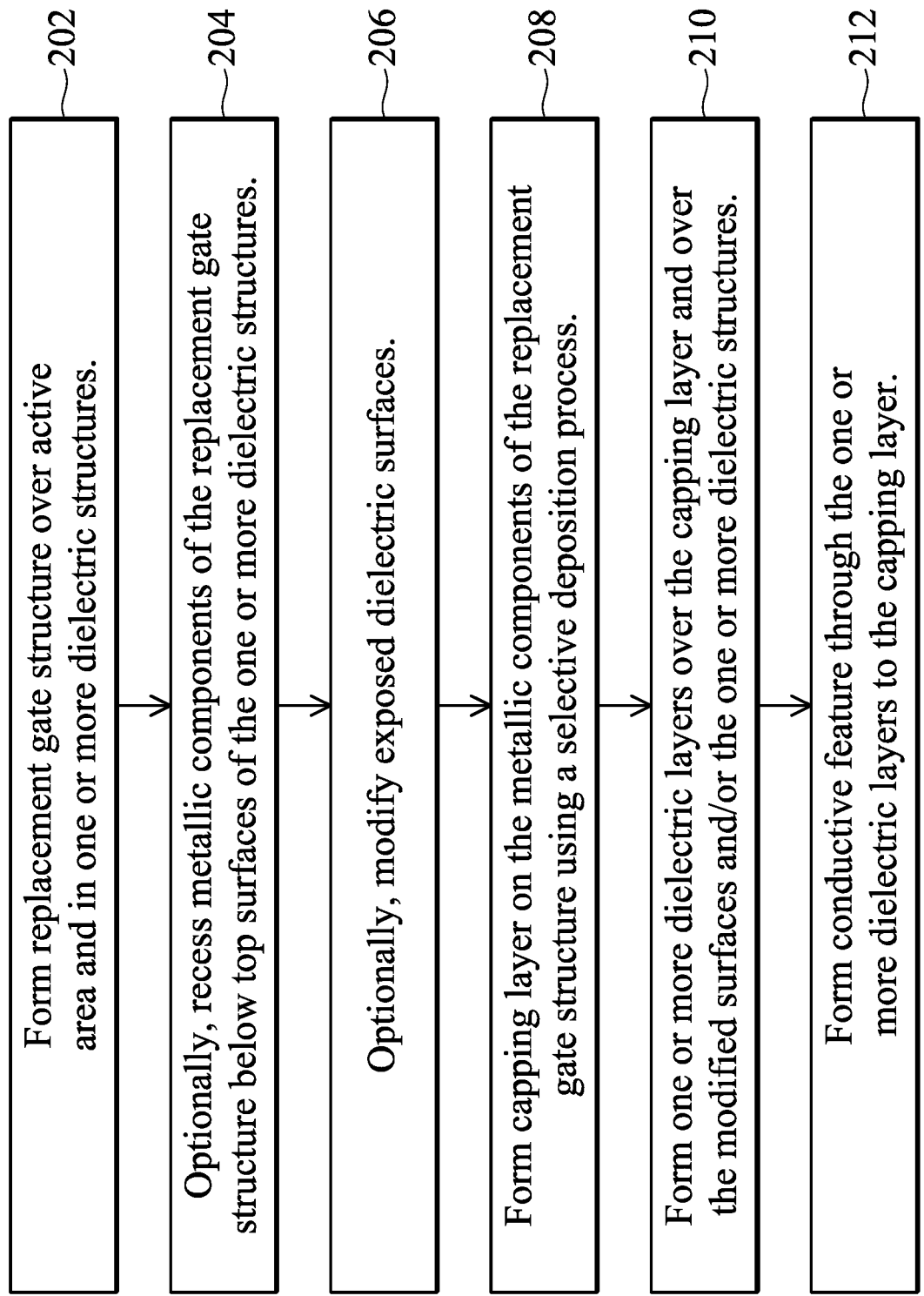
FIG. 20 is a flow chart of an example process of forming a semiconductor device in accordance with some embodiments.

FIG. 20 is a flow chart of an example process of forming a semiconductor device in accordance with some embodiments. In operation 202, a replacement gate structure is formed over an active area and in one or more dielectric structures. An example of operation 202 is described with respect to and illustrated in FIGS. 10A and 10B. For example, the replacement gate structure comprising a gate dielectric layer 112, one or more optional conformal layers 114, and gate electrode 116 is formed over the fin 74 and in the gate spacers 86, CESL 96, and first ILD 100.

In operation 204, optionally, metallic components of the replacement gate structure are recessed below top surfaces of the one or more dielectric structures. An example of operation 204 is described with respect to and illustrated in FIGS. 16A and 16B. For example, the one or more optional conformal layers 114 and gate electrode 116 are recessed below top surfaces of the gate spacers 86, CESL 96, first ILD 100, and gate dielectric layer 112.

In operation 206, optionally, exposed dielectric surfaces are modified. Examples of operation 206 are described with respect to and illustrated in FIGS. 11A and 11B and FIGS. 17A and 17B. For example, the top surfaces of the gate spacers 86, CESL 96, first ILD 100, and gate dielectric layer 112 are modified, and if operation 204 is performed, upper portions of sidewalls of the gate dielectric layer 112 can also be modified.

In operation 208, a capping layer is formed on the metallic components of the replacement gate structure using a selective deposition process. Examples of operation 208 are described with respect to and illustrated in FIGS. 12A and 12B and FIGS. 18A and 18B. For example, a capping layer 122 is formed on the one or more optional conformal layers 114 and gate electrode 116 of the replacement gate structure.

In operation 210, one or more dielectric layers are formed over the capping layer and over the modified surfaces and/or the one or more dielectric structures. Examples of operation 210 are described with respect to and illustrated in FIGS. 13A and 13B and FIGS. 19A and 19B. For example, a second ILD 130 is formed over the capping layers 122 and/or the first ILD 100, CESL 96, and gate spacers 86.

In operation 212, a conductive feature is formed through the one or more dielectric layers to the capping layer. An example of operation 212 is described with respect to FIGS.

15A and 15B. For example, a conductive feature including an adhesion layer, a barrier layer, and a conductive fill material is formed through the second ILD 130 to the capping layer 122.

FIGS. 21 through 28 are cross-sectional views of respective intermediate structures at intermediate stages in another example process of forming a semiconductor device in accordance with some embodiments. The cross-sectional views of FIGS. 21 through 28 correspond with a portion of cross-section A-A of FIG. 1, for example.

Figure 21:
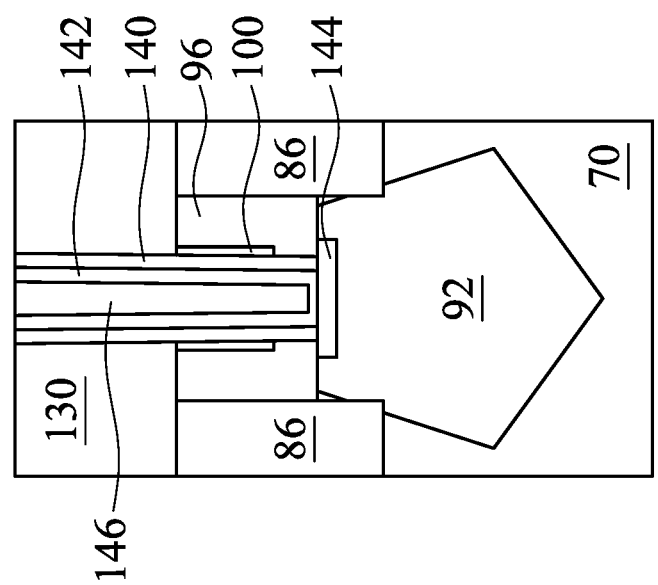

FIG. 21 illustrates a portion of the cross-sectional view of FIG. 15A. A conductive feature is through the second ILD 130, first ILD 100, and CESL 96 to an epitaxy source/drain region 92. The conductive feature comprises an adhesion layer 140, a barrier layer 142, and a conductive fill material 146. The top surfaces of the adhesion layer 140, barrier layer 142, and conductive fill material 146 are coplanar with the top surface of the second ILD 130.

Figure 22:
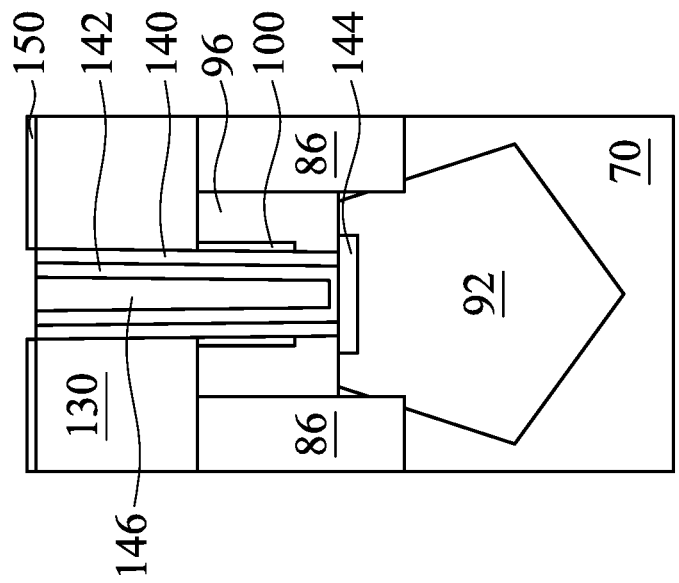
FIGS. 21 through 28 are cross-sectional views of respective intermediate structures at intermediate stages in an example process of forming a semiconductor device in accordance with some embodiments.

FIG. 22 illustrates the modification of the exposed dielectric surface of the second ILD 130 to have a modified surface 150. The modification may be performed as described above with respect to FIGS. 11A and 11B, and hence, further description here is omitted for brevity. Hence, the top surface of the second ILD 130 may be modified to be the modified surface 150.

Figure 23:
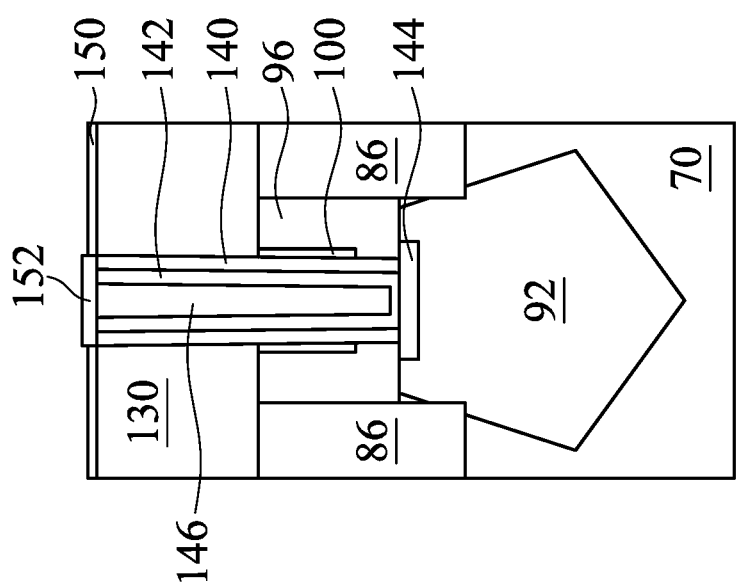

FIG. 23 illustrates the formation of a capping layer 152 on metallic surfaces of the conductive feature, such as surfaces of the conductive fill material 146, barrier layer 142, and adhesion layer 140. The formation of the capping layer 152 may be performed as described above with respect to FIGS. 12A and 12B, and hence, further description here is omitted for brevity.

As illustrated in FIG. 23, the capping layer 152 is formed on metallic surfaces of the conductive feature that are formed by the planarization process (e.g., CMP) described with respect to FIGS. 15A and 15B. The planarization process of FIGS. 15A and 15B formed the top surface of the second ILD 130 (which surface may be modified to be the modified surface 150) to be coplanar with the top surfaces of the conductive feature comprising the conductive fill material 146, barrier layer 142, and adhesion layer 140. Hence, the capping layer 152 may have a top surface at a level above the top surface of the second ILD 130, which surface may be modified to be the modified surface 150. The capping layer 152 may have a thickness in a range from about 30 Å to about 50 Å.

Figure 24:
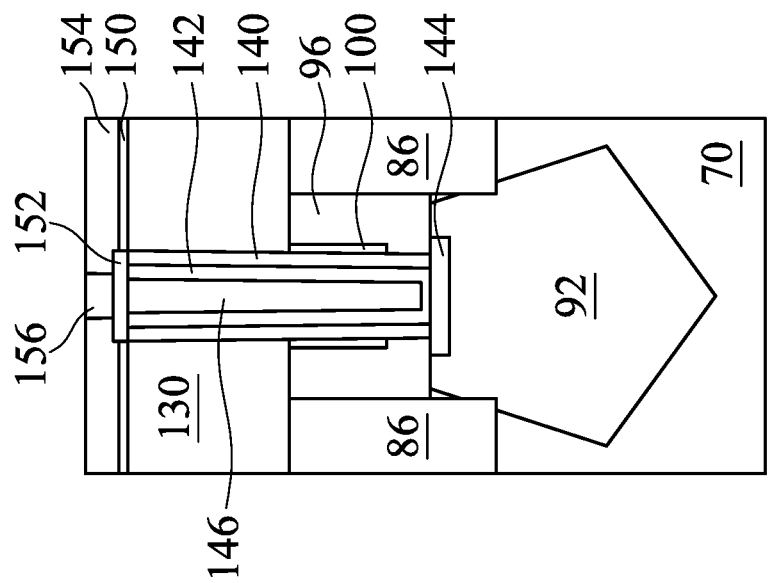

FIG. 24 illustrates the formation of a dielectric layer 154 over the modified surface 150 and capping layer 152 with a conductive feature 156 through the dielectric layer 154 contacting the capping layer 152. The dielectric layer 154 may be or include an ESL and/or an intermetallization dielectric (IMD). An ESL can be deposited on the modified surface 150 and the capping layer 152. The ESL may comprise or be silicon nitride, silicon carbon nitride, silicon carbon oxide, carbon nitride, the like, or a combination thereof, and may be deposited by CVD, PECVD, ALD, or another deposition technique. The IMD, which may be deposited over the ESL if the ESL is implemented, may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IMD may be deposited by spin-on, CVD, FCVD, PECVD, PVD, or another deposition technique.

The conductive feature 156 contacting the capping layer 152 may be or include, for example, a via or another conductive feature. The conductive feature 156 may be formed using a damascene process, such as a dual damascene process. An opening may be formed through the dielectric layer 154 using photolithography and one or more etch processes. The conductive feature 156 can be formed in the opening, for example, by depositing one or more materials of the conductive feature 156 in the opening. For example, the conductive feature 156 can include a barrier layer formed conformally in the opening and a conductive fill material formed on the barrier layer. The barrier layer may be or comprise titanium nitride, titanium oxide, tantalum nitride, tantalum oxide, the like, or a combination thereof, and may be deposited by ALD, CVD, or another deposition technique. The conductive fill material can be deposited on the barrier layer and fill the opening. The conductive fill material may be or comprise copper, tungsten, cobalt, ruthenium, aluminum, gold, silver, alloys thereof, the like, or a combination thereof, and may be deposited by CVD, ALD, PVD, plating, or another deposition technique. After the conductive fill material is deposited, excess conductive fill material and barrier layer may be removed by using a planarization process, such as a CMP, for example.

Figure 25:
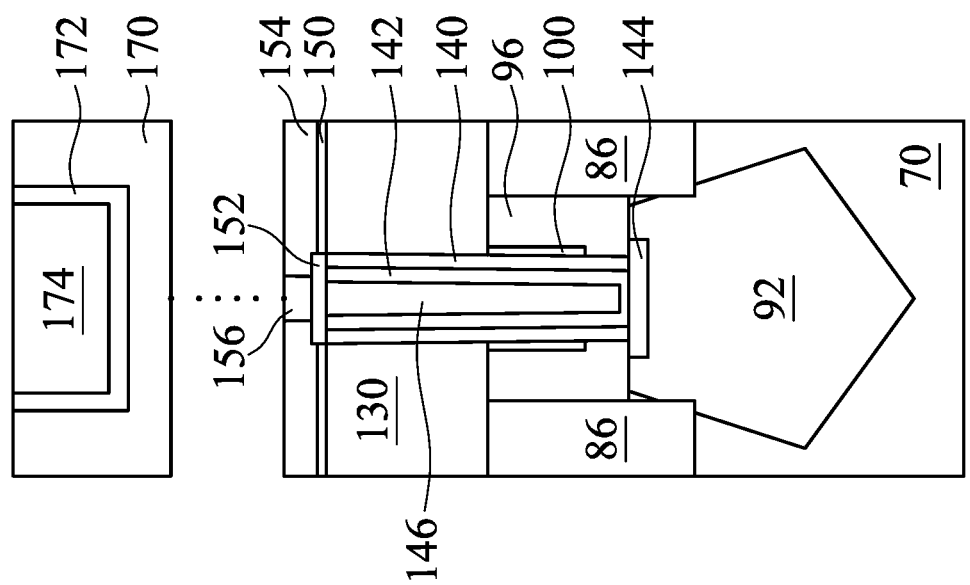

FIG. 25 illustrates the formation of an IMD 170 with a conductive feature over the intermediate structure of FIG. 24. The IMD 170 may be at any IMD level. For example, the IMD 170 may be the immediately next IMD over the intermediate structure of FIG. 24 (e.g., as a part of or immediately over the dielectric layer 154) or any number of IMD levels may be between the dielectric layer 154 and the IMD 170. The IMD 170 may comprise or be silicon dioxide, a low-k dielectric material, such as silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof. The IMD 170 may be deposited by spin-on, CVD, FCVD, PECVD, PVD, or another deposition technique.

The conductive feature includes a barrier layer 172 and conductive fill material 174. The conductive feature may be formed using a damascene process, such as a dual damascene process. The conductive feature may be a conductive line, pad, or the like, and may further comprise a via to an underlying conductive feature. An opening and/or recess may be formed in and/or through the IMD 170 using photolithography and one or more etch processes. The barrier layer 172 is formed conformally in the opening and/or recess, and the conductive fill material 174 is formed on the barrier layer 172. The barrier layer 172 may be or comprise titanium nitride, titanium oxide, tantalum nitride, tantalum oxide, the like, or a combination thereof, and may be deposited by ALD, CVD, or another deposition technique. The conductive fill material 174 can be deposited on the barrier layer 172 and fill the opening and/or recess. The conductive fill material 174 may be or comprise copper, tungsten, cobalt, ruthenium, aluminum, gold, silver, alloys thereof, the like, or a combination thereof, and may be deposited by CVD, ALD, PVD, plating, or another deposition technique. After the conductive fill material 174 is deposited, excess conductive fill material 174 and barrier layer 172 may be removed by using a planarization process, such as a CMP, for example.

Figure 26:
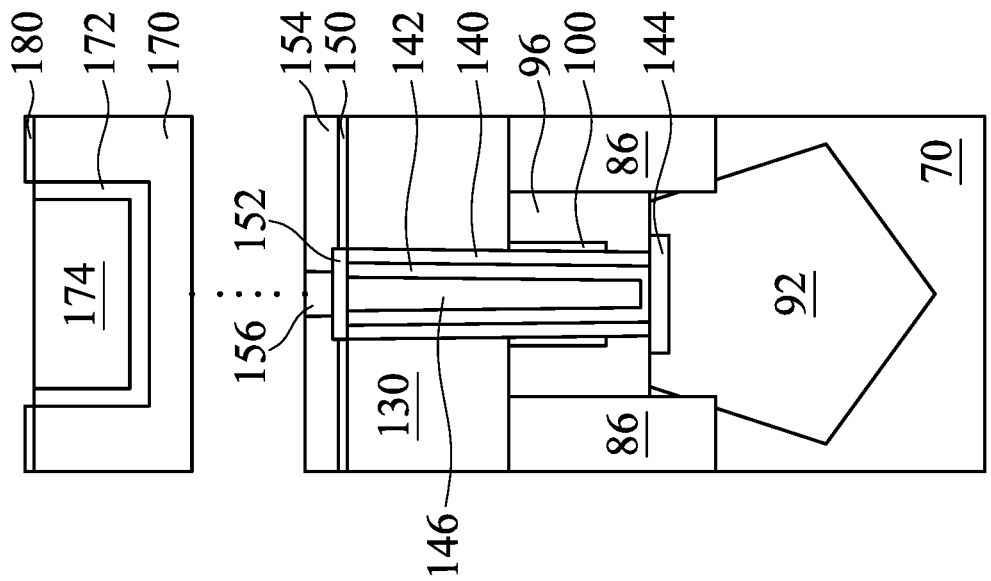

FIG. 26 illustrates the modification of the exposed dielectric surface of the IMD 170 to have a modified surface 180. The modification may be performed as described above with respect to FIGS. 11A and 11B, and hence, further description here is omitted for brevity. Hence, the top surface of the IMD 170 may be modified to be the modified surface 180.

Figure 27:
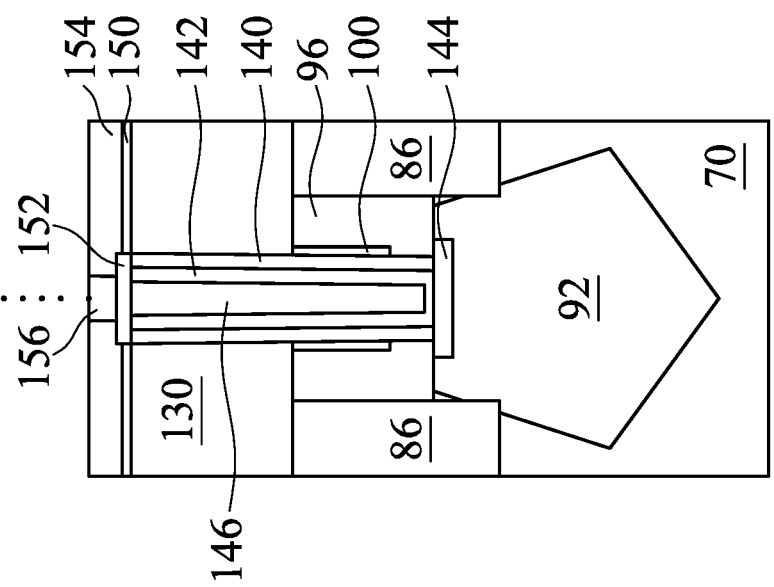

FIG. 27 illustrates the formation of a capping layer 182 on metallic surfaces of the conductive feature, such as surfaces of the conductive fill material 174 and barrier layer 172. The formation of the capping layer 182 may be performed as described above with respect to FIGS. 12A and 12B, and hence, further description here is omitted for brevity.

As illustrated in FIG. 27, the capping layer 182 is formed on metallic surfaces of the conductive feature that are formed by the planarization process (e.g., CMP) described with respect to FIG. 25. The planarization process of FIG. 25 formed the top surface of the IMD 170 (which surface may be modified to be the modified surface 180) to be coplanar with the top surfaces of the conductive feature comprising the conductive fill material 174 and barrier layer 172. Hence, the capping layer 182 may have a top surface at a level above the top surface of the IMD 170, which surface may be modified to be the modified surface 180. The capping layer 182 may have a thickness in a range from about 30 Å to about 50 Å.

Figure 28:
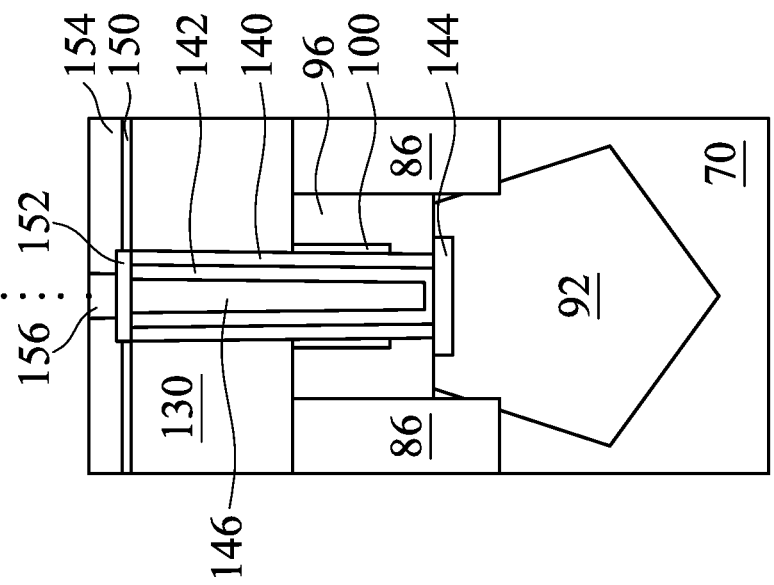

FIG. 28 illustrates the formation of a dielectric layer 184 over the modified surface 180 and capping layer 182 with a conductive feature 186 through the dielectric layer 184 contacting the capping layer 182. The dielectric layer 184 may be or include an ESL and/or an IMD. An ESL and/or IMD and the conductive feature 186 may be formed as described above with respect to FIG. 24, and hence, further description here is omitted for brevity.

Although not illustrated, the conductive features of FIGS. 21 and 25 can be recessed before the respective dielectric surfaces are modified in FIGS. 22 and 26. The recessing may be performed as described above with respect to FIGS. 16A and 16B, and hence, further description here is omitted for brevity.

Recessing can permit upper portions of sidewalls of the second ILD 130 to be modified (e.g., in the processing of FIG. 22) where the conductive feature was recessed. When the conductive feature of FIG. 21 is recessed, the capping layer 152 has a bottom surface that is below the modified surface 150 and/or top surface of the second ILD 130, and a top surface of the capping layer 152 can be above, level with, or below the modified surface 150 and/or top surfaces of the second ILD 130. Further, sidewalls of the capping layer 152 can abut the modified surfaces 150 of the upper portions of the sidewalls of the second ILD 130 and/or can abut the sidewalls of the second ILD 130. Similarly, recessing can permit upper portions of sidewalls of the IMD 170 to be modified (e.g., in the processing of FIG. 26) where the conductive feature was recessed. When the conductive feature (comprising conductive fill material 174) of FIG. 25 is recessed, the capping layer 182 has a bottom surface that is below the modified surface 180 and/or top surface of the IMD 170, and a top surface of the capping layer 182 can be above, level with, or below the modified surface 180 and/or top surfaces of the IMD 170. Further, sidewalls of the capping layer 182 can abut the modified surfaces 180 of the upper portions of the sidewalls of the IMD 170 and/or can abut the sidewalls of the IMD 170.

Figure 29:
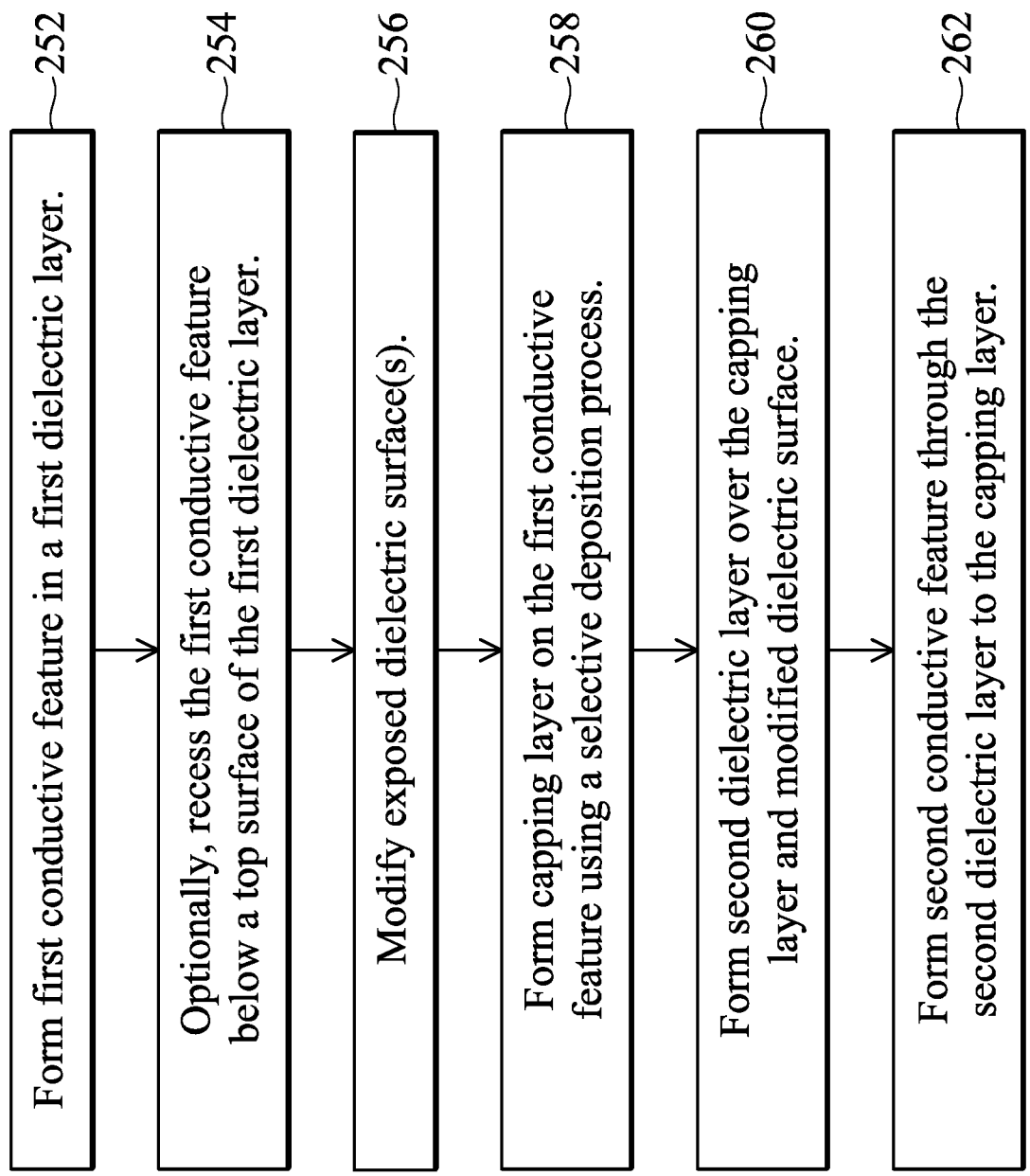
FIG. 29 is a flow chart of an example process of forming a semiconductor device in accordance with some embodiments.

FIG. 29 is a flow chart of an example process of forming a semiconductor device in accordance with some embodiments. In operation 252, a first conductive feature is formed in a first dielectric layer. Examples of operation 252 are described with respect to and illustrated in FIG. 21 and FIG. 25. For example, the conductive feature comprising the adhesion layer 140, barrier layer 142, and conductive fill material 146 is formed in the second ILD 130, first ILD 100, and CESL 96. As another example, the conductive feature comprising the barrier layer 172 and conductive fill material 174 is formed in the IMD 170.

In operation 254, optionally, the first conductive feature is recessed below a top surface of the first dielectric layer. Examples of operation 254 are described above. For example, the conductive feature (comprising the conductive fill material 146) of FIG. 21 can be recessed below the top surface of the second ILD 130. As another example, the conductive feature (comprising the conductive fill material 174) of FIG. 25 can be recessed below the top surface of the IMD 170.

In operation 256, exposed dielectric surfaces, e.g., of the first dielectric layer, are modified. Examples of operation 256 are described with respect to and illustrated in FIG. 22 and FIG. 26. As examples, the top surfaces of the second ILD 130 and IMD 170 are modified.

In operation 258, a capping layer is formed on the first conductive feature using a selective deposition process. Examples of operation 258 are described with respect to and illustrated in FIG. 23 and FIG. 27. As examples, capping layer 152 and 182 are formed on conductive features comprising, respectively, (i) the conductive fill material 146, barrier layer 142, and adhesion layer 140, and (ii) the conductive fill material 174 and barrier layer 172.

In operation 260, a second dielectric layer is formed over the capping layer and over the modified dielectric surface. Examples of operation 260 are described with respect to and illustrated in FIG. 24 and FIG. 28. For example, the dielectric layers 154 and 184 are formed over the capping layers 152 and 182 and the modified surfaces 150 and 180, respectively.

In operation 262, a second conductive feature is formed through the second dielectric layer to the capping layer. Examples of operation 262 are described with respect to and illustrated in FIG. 24 and FIG. 28. For example, conductive features 156 and 186 are formed through the dielectric layers 154 and 184 to the capping layers 152 and 182, respectively.

Some embodiments may achieve advantages. For example, a surface modification process to modify a dielectric surface of a dielectric layer can create a selective protection layer on the dielectric layer. The protection layer (e.g., modified dielectric surface) can increase selectivity of a subsequent selective deposition process, such as for selectively depositing a capping layer (e.g., metal cap), and can reduce damage of the dielectric layer. For example, the protection layer (e.g., modified dielectric surface) can terminate dangling bonds on the surface of the dielectric layer, which can reduce unexpected deposition of metal during the selective deposition of the capping layer. Further, the protection layer can reduce process gases and metal ions from attacking and diffusing into the dielectric layer. Hence, defects in and leakage through the dielectric layer can be reduced.

In some examples, forming a capping layer on a gate structure, such as a replacement gate structure, can reduce gate resistance ($R_g$), particularly in short channel devices. In some instances, such as in a replacement gate process where a dimension of the gate structure (e.g., in the channel length direction) is small, high resistance conductive components, such as barrier, capping, and/or work-function tuning layers, can increase in size proportionally relative to the dimension of the gate structure, whereas a low resistance conductive component, such as the gate electrode, decreases in size proportionally relative to the dimension of the gate structure. A capping layer formed on the replacement gate structure can offset some increase in resistance as a result of the decreasing in the size of the dimension of the replacement gate structure. Further, example processes described herein can avoid masking and patterning processes, and thereby avoid processes that could increase cost, while reducing the gate resistance. Advantages of some embodiments, such as the capping layer on a gate structure and/or the surface modification process, can be particularly applicable in small technology nodes, such as 7 nm and smaller.

An embodiment is a method. A conductive feature is formed in a first dielectric layer. The conductive feature has a metallic surface, and the first dielectric layer has a dielectric surface. The dielectric surface is modified to be hydrophobic by performing a surface modification treatment. After modifying the dielectric surface, a capping layer is formed on the metallic surface by performing a selective deposition process. A second dielectric layer is formed over the capping layer and the dielectric surface.

Another embodiment is a structure. The structure includes a first dielectric layer over a substrate, a conductive feature in the first dielectric layer, and a metal cap on the conductive feature. The first dielectric layer has a dielectric surface terminated with a species including a hydrophobic functional group. The structure also includes a second dielectric layer on the dielectric surface and the metal cap.

A further embodiment is a method. A gate structure is formed over an active area on a substrate. A surface of the gate structure is exposed through a first dielectric layer. A capping layer is formed on the surface of the gate structure by performing a selective deposition process. A second dielectric layer is formed over the capping layer and the first dielectric layer. A conductive feature is formed through the second dielectric layer to the capping layer.

A yet further embodiment is a structure. The structure includes a gate structure over an active area on a substrate, a first dielectric layer over the substrate and along the gate structure, a metal cap on the gate structure, a second dielectric layer over the metal cap and the first dielectric layer, and a conductive feature through the second dielectric layer to the metal cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a gate structure embedded within a dielectric layer over a semiconductor fin;
   selectively reacting a reactant with the dielectric layer to form a monolayer of a hydrophobic material; and
   selectively depositing tungsten onto the gate structure, the tungsten having a chlorine concentration of less than about 1%.

2. The method of claim 1, wherein the reactant comprises tetramethylsilane ($Si(CH_3)_4$).

3. The method of claim 1, wherein the reactant comprises N,N-dimethyltrimethylsilylamine (($CH_3$)$_2$—N—Si—($CH_3$)$_3$).

4. The method of claim 1, wherein the reactant comprises a silane derivative.

5. The method of claim 1, wherein the selectively reacting the reactant comprises a wet process.

6. The method of claim 1, wherein the selectively reacting the reactant comprises a dry process.

7. The method of claim 1, further comprising recessing the gate structure prior to the selectively reacting the reactant with the dielectric layer.

8. A method of manufacturing a semiconductor device, the method comprising:
   depositing a dielectric layer over a source/drain region;
   forming a gate structure planar with the dielectric layer;
   exposing the dielectric layer to a silane derivative with one or more hydrophobic functional groups;
   exposing the gate structure to fluorine-free tungsten precursors; and
   depositing a second dielectric layer over a product of the fluorine-free tungsten precursors.

9. The method of claim 8, wherein the exposing the gate structure to the fluorine-free tungsten precursors forms a tungsten material with a chlorine concentration of less than 1%.

10. The method of claim 8, wherein the exposing the dielectric layer comprises a wet process.

11. The method of claim 10, wherein the wet process immerses the dielectric layer to a bath comprising the silane derivative.

12. The method of claim 11, wherein the bath has a temperature of between about 20° C. and about 80° C.

13. The method of claim 12, wherein the bath is a mixture of the silane derivative, isopropyl alcohol, and deionized water.

14. The method of claim 8, recessing the gate structure after the forming the gate structure planar with the dielectric layer.

15. A method of manufacturing a semiconductor device, the method comprising:
   forming a first conductive contact through a first dielectric layer to make physical contact with a capping layer and to make electrical contact with a gate structure, wherein there is less than 1% of chlorine within the capping layer; and
   forming a second conductive contact through the first dielectric layer, a second dielectric layer, and a monolayer between the first dielectric layer and the second dielectric layer to make electrical contact with a source/drain region adjacent to the gate structure, the monolayer comprising hydrophobic functional groups.

16. The method of claim 15, wherein the hydrophobic functional groups comprises a hydrocarbon.

17. The method of claim 16, wherein the hydrophobic functional groups have a general form of —$C_xH_{2x+1}$.

18. The method of claim 15, wherein the capping layer has a thickness in a range from 30 Å to 50 Å.

19. The method of claim 15, wherein the capping layer has a concentration of chlorine that is less than 1%.

20. The method of claim 15, wherein the capping layer has a bottom surface that shares a plane with a top surface of the second dielectric layer.

* * * * *